United States Patent
Xu et al.

(10) Patent No.: US 12,368,261 B2
(45) Date of Patent: Jul. 22, 2025

(54) CONDUCTIVE TERMINAL, CONDUCTIVE TERMINAL ASSEMBLY AND CONNECTOR

(71) Applicant: Bellwether Electronic (Kunshan) Co., Ltd, Kunshan (CN)

(72) Inventors: Guang-Lei Xu, Kunshan (CN); Li-Yong Bai, Kunshan (CN)

(73) Assignee: Bellwether Electronic (Kunshan) Co., Ltd, Kunshan (CN)

( * ) Notice: Subject to any disclaimer, the term of this patent is extended or adjusted under 35 U.S.C. 154(b) by 416 days.

(21) Appl. No.: 17/849,685

(22) Filed: Jun. 26, 2022

(65) Prior Publication Data

US 2023/0299529 A1    Sep. 21, 2023

(30) Foreign Application Priority Data

Mar. 16, 2022    (CN) .......................... 202210259313.3

(51) Int. Cl.

| H01R 13/40 | (2006.01) |
|---|---|
| H01R 13/04 | (2006.01) |
| H01R 13/405 | (2006.01) |
| H01R 13/514 | (2006.01) |
| H01R 12/58 | (2011.01) |

(52) U.S. Cl.
CPC ........... *H01R 13/405* (2013.01); *H01R 13/04* (2013.01); *H01R 13/514* (2013.01); *H01R 12/58* (2013.01)

(58) Field of Classification Search
CPC .... H01R 13/405; H01R 13/04; H01R 13/514; H01R 12/58
USPC ........................................ 439/79, 947, 733, 1
See application file for complete search history.

(56) References Cited

U.S. PATENT DOCUMENTS

| 6,464,521 | B1 * | 10/2002 | Kurotori | .............. H01R 12/727 439/325 |
| 7,833,026 | B1 * | 11/2010 | Morgan | ............... H01R 12/722 439/607.05 |
| 10,492,298 | B1 * | 11/2019 | Chen | ...................... H05K 1/116 |
| 10,594,080 | B2 * | 3/2020 | Sugiki | .................... H01R 12/91 |

* cited by examiner

*Primary Examiner* — Phuong K Dinh
(74) *Attorney, Agent, or Firm* — Li & Cai Intellectual Property Office

(57) ABSTRACT

A conductive terminal, a conductive terminal assembly and a connector are provided. The conductive terminal assembly includes a casing and at least one row of conductive terminals. The at least one row of conductive terminals includes a plurality of conductive terminals arranged side by side. Each conductive terminal includes a contact arm, a contact pin, an extension part and a tenon structure. The contact arm extends along a first direction, the contact pin extends along a second direction, and the first direction is perpendicular to the second direction. The extension part is connected between the contact arm and the contact pin, and the extension part is bent and extended relative to the contact pin. The tenon structure is connected to one of the contact arm and the contact pin. The tenon structure extends in parallel along the first direction or the second direction.

19 Claims, 20 Drawing Sheets

CONDUCTIVE TERMINAL, CONDUCTIVE TERMINAL ASSEMBLY AND CONNECTOR

CROSS-REFERENCE TO RELATED PATENT APPLICATION

This application claims the benefit of priority to China Patent Application No. 202210259313.3, filed on Mar. 16, 2022 in People's Republic of China. The entire content of the above identified application is incorporated herein by reference.

Some references, which can include patents, patent applications and various publications, can be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a conductive terminal, a conductive terminal assembly and a connector, and more particularly to a conductive terminal with a tenon structure, and a connector including a conductive terminal assembly composed of a plurality of conductive terminals.

BACKGROUND OF THE DISCLOSURE

In the related art, a conductive terminal assembly of a connector can be made of metal and plastic into an integrated product by means of insert molding, or the conductive terminal made of metal can be assembled in a plastic casing by means of assembly. However, when the conductive terminals are assembled to the casing, the bonding strength between the conductive terminals and the casing is usually insufficient, and the conductive terminals are easily separated from the casing. In addition, in the related art, a single conductive terminal can be inserted into the casing by one assembling step, so that it is necessary to insert a plurality of conductive terminals into the casing through a plurality of assembling steps, which is quite time-consuming.

Therefore, how to overcome the above-mentioned defects through the improvement of structural design has become one of the important issues to be solved in this field.

SUMMARY OF THE DISCLOSURE

In response to the above-referenced technical inadequacy, the present disclosure provides a conductive terminal, a conductive terminal assembly and a connector.

In one aspect, the present disclosure provides a conductive terminal, which includes a contact arm, a contact pin, an extension part and a tenon structure. The contact arm is extended along a first direction. The contact pin is extended along a second direction, and the first direction is perpendicular to the second direction. The extension part is connected between the contact arm and the contact pin, and the extension part is bent and extended relative to the contact pin. The tenon structure is connected to one of the contact arm and the contact pin, and the tenon structure parallelly extends along the first direction or the second direction.

In another aspect, the present disclosure provides a conductive terminal assembly, which includes a casing and at least one conductive terminal row. The casing has a plurality of accommodating grooves formed thereinside. Each of the accommodating grooves has an opening formed on a first surface thereof, and a slot formed on a second surface thereof, and the opening and the slot of each of the accommodating grooves are communicated with each other. The at least one conductive terminal row includes a plurality of conductive terminals arranged side by side. The conductive terminals are inserted into one of the accommodating grooves and positioned along a positioning direction, and each of the conductive terminals includes a tenon structure connected to one side of the conductive terminal and extended along the positioning direction.

In yet another aspect, the present disclosure provides a connector, which includes a cover, a conductive terminal assembly and a plurality of conductive assemblies. The cover has a first accommodating portion and a plurality of second accommodating portions. The conductive terminal assembly is disposed in the first accommodating portion. The plurality of conductive assemblies are respectively disposed in the second accommodating portions. Each of the conductive assemblies includes two conductive elements arranged in mirror symmetry, each of the conductive elements includes a first sheet portion, a second sheet portion, a turning portion and a plurality of foot posts, the second sheet portion is connected between the first sheet portion and the foot posts, the turning portion is connected between the first sheet portion and the second sheet portion, the foot posts extend along a first direction, the first sheet portion extends along a second direction, and the first direction is perpendicular to the second direction.

Therefore, one of the beneficial effects of the present disclosure is that the conductive terminal, the conductive terminal assembly and the connector provided by the present disclosure can position the conductive terminals on the casing through the tenon structure of the conductive terminal so as to strengthen the structural strength of positioning the conductive terminal on the casing. In addition, the present disclosure can also divide the interior of the casing into a plurality of accommodating grooves, so that the plurality of conductive terminals can be inserted into one of the accommodating grooves in a row form, so that the present disclosure can solve the question of the related art (which can only insert a single conductive terminal into the casing at one time during the assembly process) and improve the efficiency of the assembly process.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments can be better understood by reference to the following description and the accompanying drawings, in which.

DETAILED DESCRIPTION OF THE EXEMPLARY EMBODIMENTS

Figure 1:
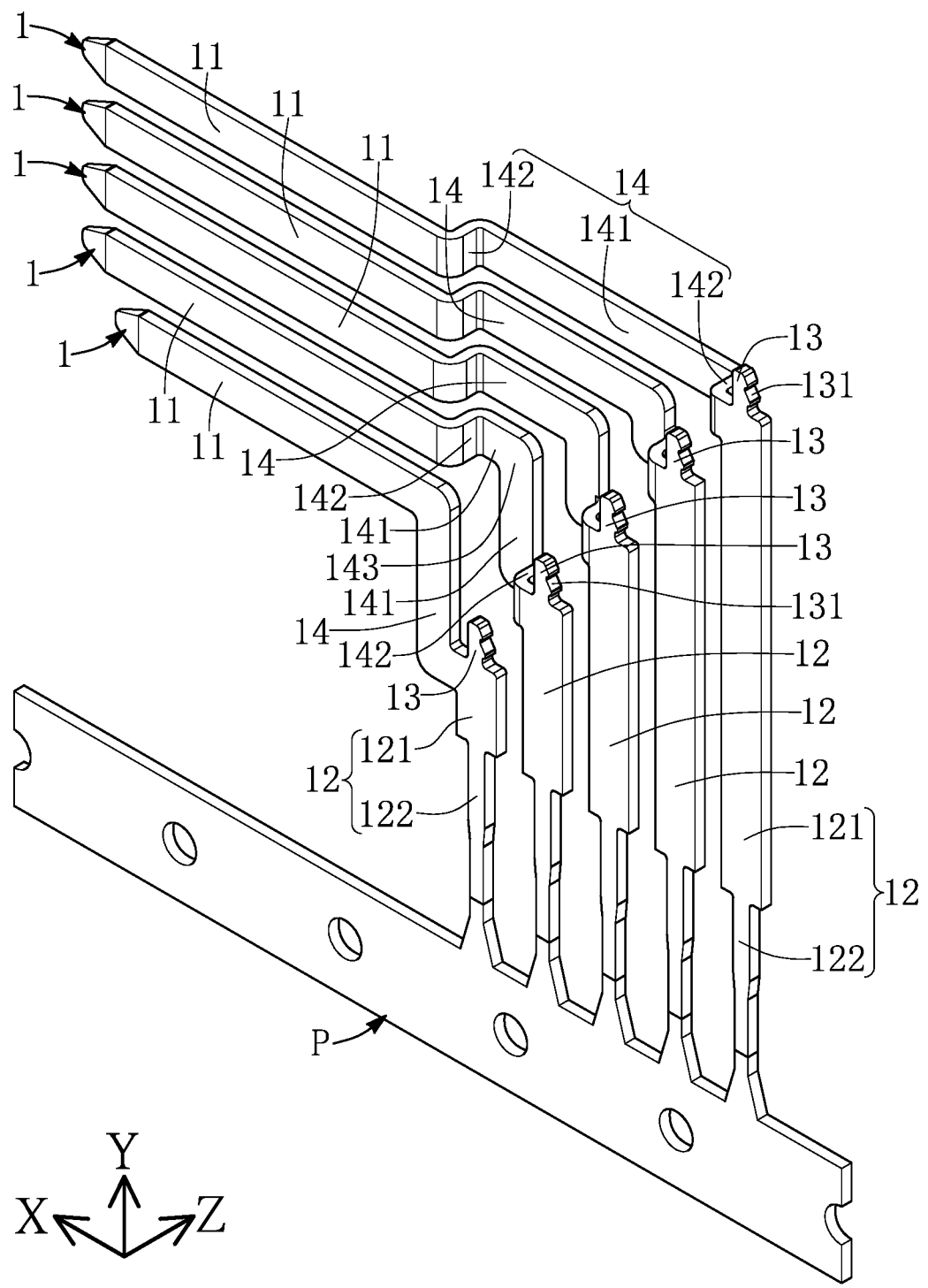
FIG. 1 is a schematic perspective view of a conductive terminal according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic perspective view of a conductive terminal according to a first embodiment of the present disclosure. The first embodiment of the present disclosure provides a conductive terminal 1. Specifically, FIG. 1 shows a row of conductive terminals (a conductive terminal row) including a plurality of conductive terminals 1 (such as five conductive terminals 1) arranged side by side. The present disclosure is not limited by the number of conductive terminals 1. Referring to any one of the conductive terminals 1 in FIG. 1, the conductive terminal 1 includes a contact arm 11, a contact pin 12, a tenon structure 13 (such as a plug structure) and an extension part 14, and the contact pin 12 of the conductive terminals 1 are commonly connected to a metal strip P.

The contact arm 11 is extended along a first direction (a positive X-axis direction), the contact pin 12 is extended along a second direction (a negative Y-axis direction), and the contact pin 12 is perpendicular to the contact arm 11 (that is to say, the first direction is perpendicular to the second direction). The contact pin 12 has a body portion 121 and a soldering portion 122. The soldering portion 122 is connected to one end of the body portion 121. The tenon structure 13 is connected to one side of the conductive terminal 1. More particularly, the tenon structure 13 is preferably connected to one of the contact arm 11 and the contact pin 12 and parallel to one of the first direction and the second direction. In this embodiment, for example, the tenon structure 13 is connected to another end of the body portion 121 and parallel to the extending direction of the contact pin 12 as shown in FIG. 1 (in another embodiment, the extension part 14 as shown in FIG. 1 can serve as a contact arm, and the contact arm 11 as shown in FIG. 1 can serve as a contact pin). The tenon structure 13 has at least one hook portion 131 (such as a barb portion) formed on at least one side thereof. The extension part 14 is connected between the contact arm 11 and the contact pin 12. Furthermore, one end of the extension part 14 is adjacent to the tenon structure 13 and is bent and extended relative to the contact pin 12, and the extending direction of the extension part 14 is perpendicular to the extending direction of the tenon structure 13 relative to the body portion 121. In addition, the extending directions of the tenon structures 13 of the conductive terminals 1 in the conductive terminal row are parallel to each other.

In one of the conductive terminals 1, the extension part 14 includes at least one extending section 141 and a plurality of bending sections 142, the bending sections 142 are located on at least one end of the extending section 141. The bending section 142 is bent in the negative Z-axis direction relative to the extension direction of the extending section 141, and preferably the bending section 142 and the extending section 141 are perpendicular to each other.

In this embodiment, the two bending sections 142 are disposed at both ends of the extending section 141 to form at least one U-shaped structure. For example, as shown in FIG. 1, regarding to the rightmost one of the conductive terminals 1 in the X-axis direction (i.e., the conductive terminal 1 with the longest length of the body portion 121), the extension part 14 of the conductive terminal 1 includes an extending section 141 and two bending sections 142 respectively connected to two ends of the extending section 141 to form a U-shaped structure (that is to say, the U-shaped structure includes the extending section 141 and the two bending sections 142). In other words, except for the leftmost one of the conductive terminals 1, in each of the other conductive terminals 1, the contact arm 11 is located on a first plane, and the extending section 141 of the extension part 14 is located on a second plane, and the first plane and the second plane are both parallel to the X-Y plane but are not coplanar. Furthermore, since the extension parts 14 of the conductive terminals 1 are all bent and extended, the extension parts 14 of the conductive terminals 1 can also define different coplanar planes, and the first plane on which the contact arm 11 is located can be located on one of the coplanar planes (or the first plane coincides with one of the coplanar planes).

In addition, for example, regarding to the leftmost conductive terminal 1 in the X-axis direction as shown in FIG. 1 (i.e., the conductive terminal 1 with the shortest length of the body portion 121), the extension part 14 of the conductive terminal 1 only includes an extending section 141 perpendicular to the contact arm 11.

Moreover, for example, regarding to the other three conductive terminals 1 between the rightmost conductive terminal 1 and the leftmost conductive terminal 1 in the X-axis direction as shown in FIG. 1, the extending section 141 of each of the three conductive terminals 1 further includes a curved portion 143 (that is to say, the extending section 141 is divided into two parts by the curved portion 143, and the two parts are respectively connected to both ends of the curved portion 143). The extension direction of one part of the extending section 141 connecting to one end of the curved portion 143 and the extension direction of another part of the extending section 141 connecting to another end of the curved portion 143 are not parallel to each other. That is to say, the curved portion 143 is bent in the second direction (i.e., the negative Y-axis direction), so that the two parts of the extending section 141 respectively connecting to the two ends of the curved portion 143 have an included angle less than 180 degrees. The included angle is preferably 90 degrees so that the extending section 141 is in an L-shaped shape. As shown in FIG. 1, the two bending sections 142 are respectively connected to two ends of the extending section 141 (that is to say, one of the bending sections 142 is connected between a first end of the extension part 14 and the contact arm 11, and the other bending section 142 is connected between a second end of the extension part 14 and the contact pin 12) to form a U-shaped structure (that is to say, the U-shaped structure includes the extending section 141 and the two bending sections 142).

Figure 2:
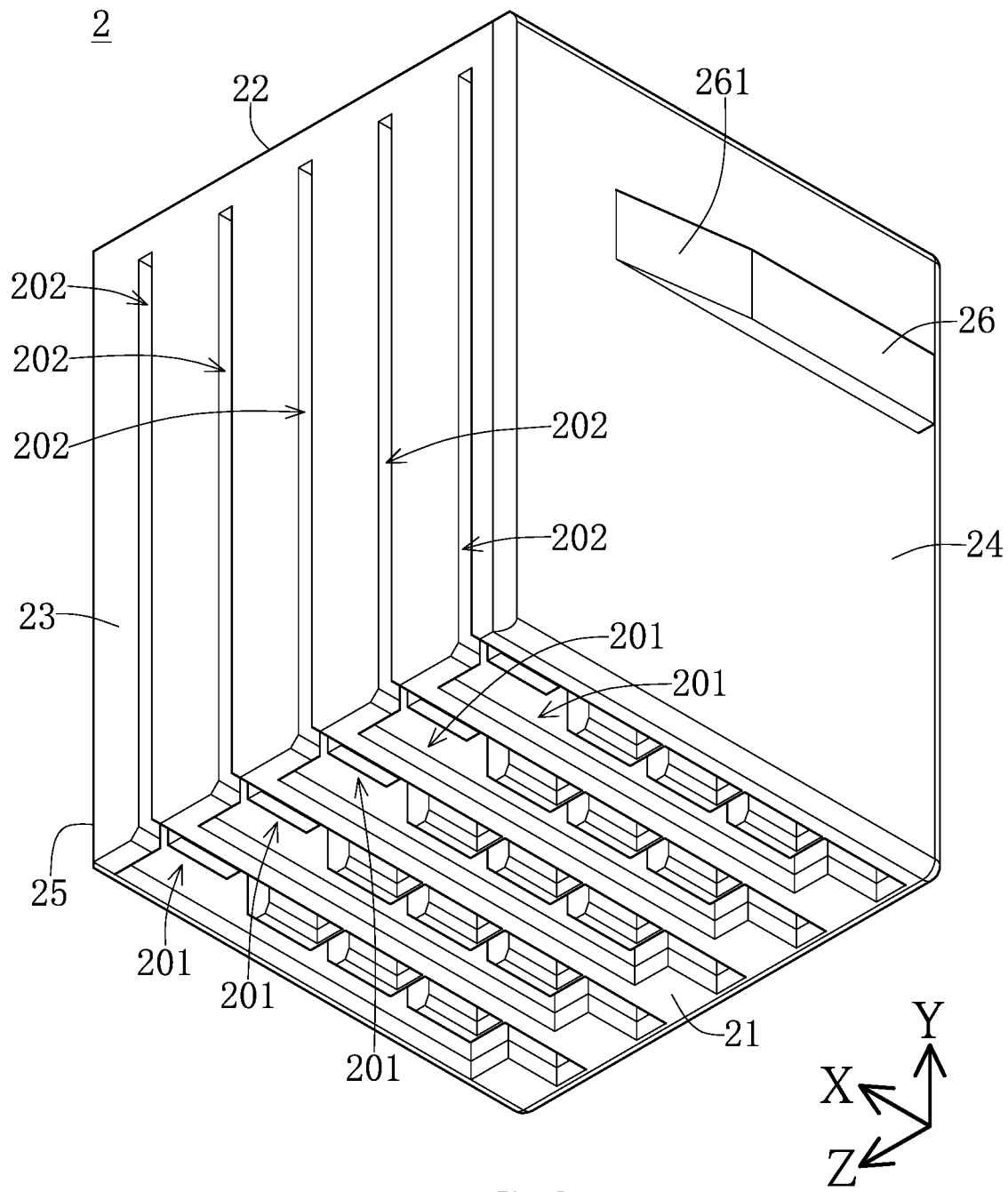
FIG. 2 is a schematic perspective view of a casing according to the first embodiment of the present disclosure.
Figure 7:
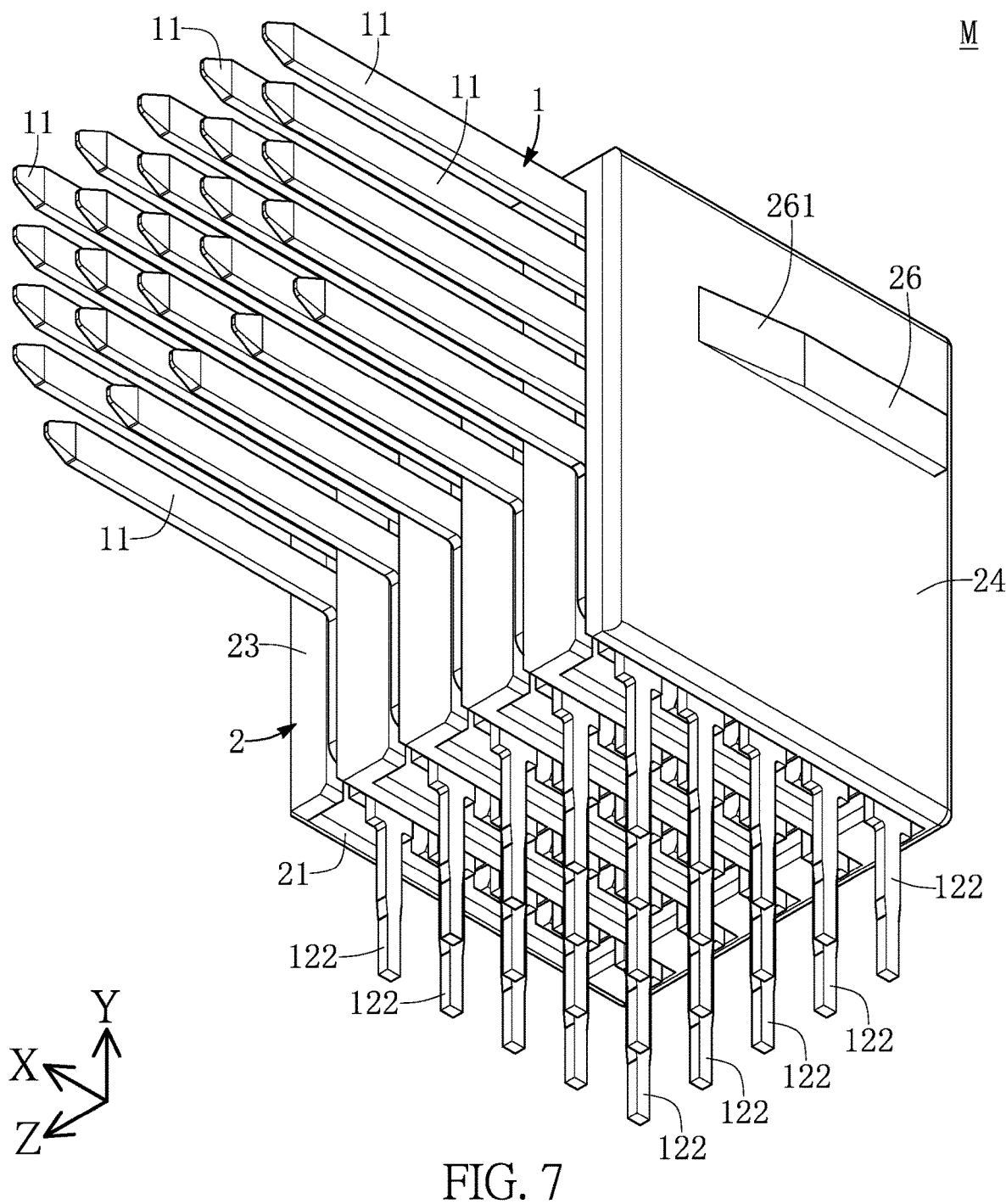
FIG. 7 is a schematic perspective view of the conductive terminal assembly according to the first embodiment of the present disclosure.

Next, referring to FIG. 1, FIG. 2 and FIG. 7, FIG. 2 is a schematic perspective view of the casing of the first embodiment of the present disclosure, and FIG. 7 is a schematic perspective view of the conductive terminal assembly of the first embodiment of the present disclosure. The present disclosure provides a conductive terminal assembly M. The conductive terminal assembly M includes a plurality of rows of conductive terminals (such as five conductive terminal rows as shown in this embodiment) and a casing 2. The present disclosure is not limited by the number of rows of conductive terminals 1. Each row of conductive terminals includes a plurality of conductive terminals 1 arranged side by side, and an inner space of the casing 2 can be divided into a plurality of accommodating grooves 20 (such as five accommodating grooves 20 as shown in this embodiment), and the conductive terminal rows are respectively inserted into the accommodating grooves 20.

Figure 3:
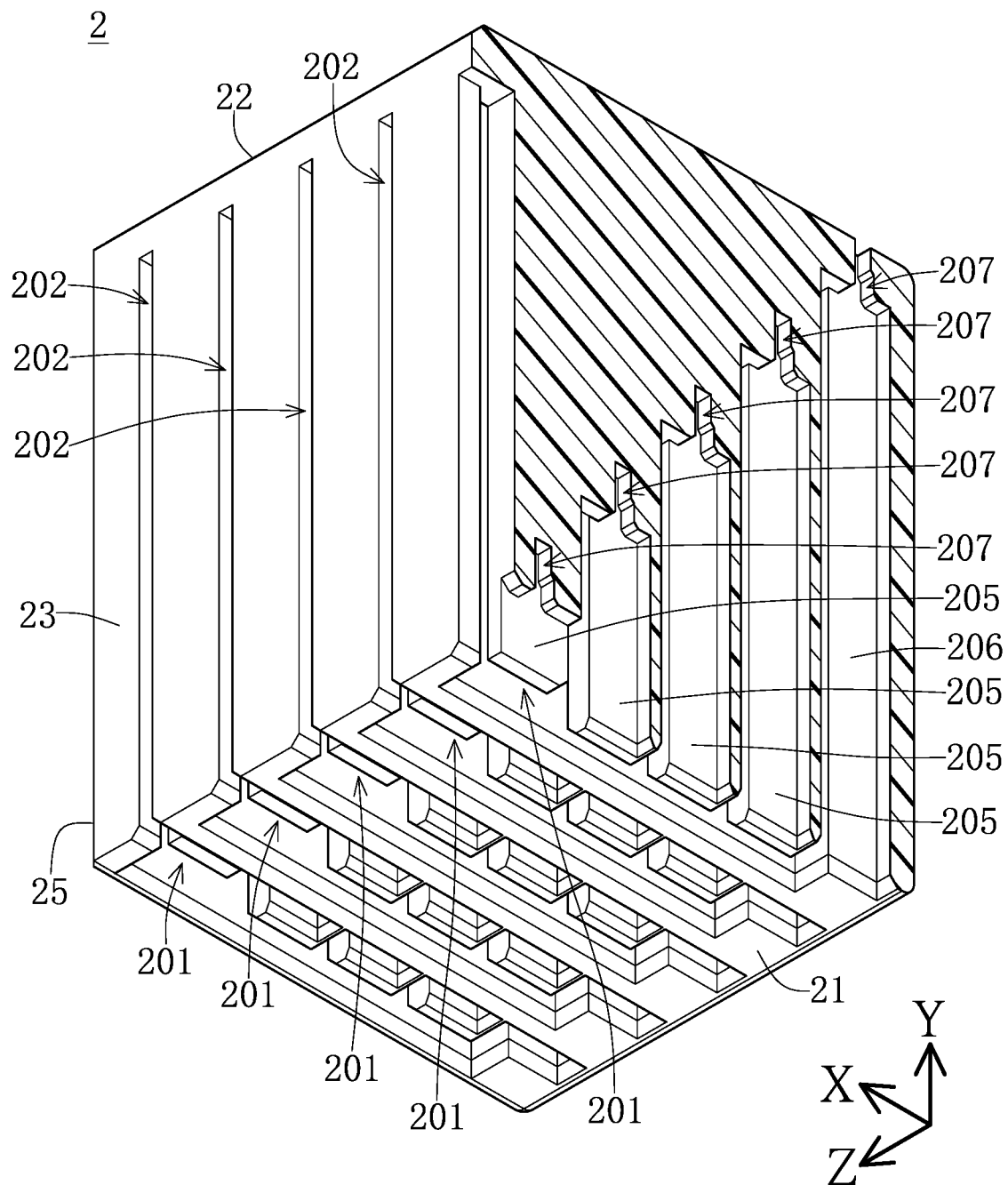
FIG. 3 is a schematic cross-sectional view of the casing according to the first embodiment of the present disclosure.
Figure 4:
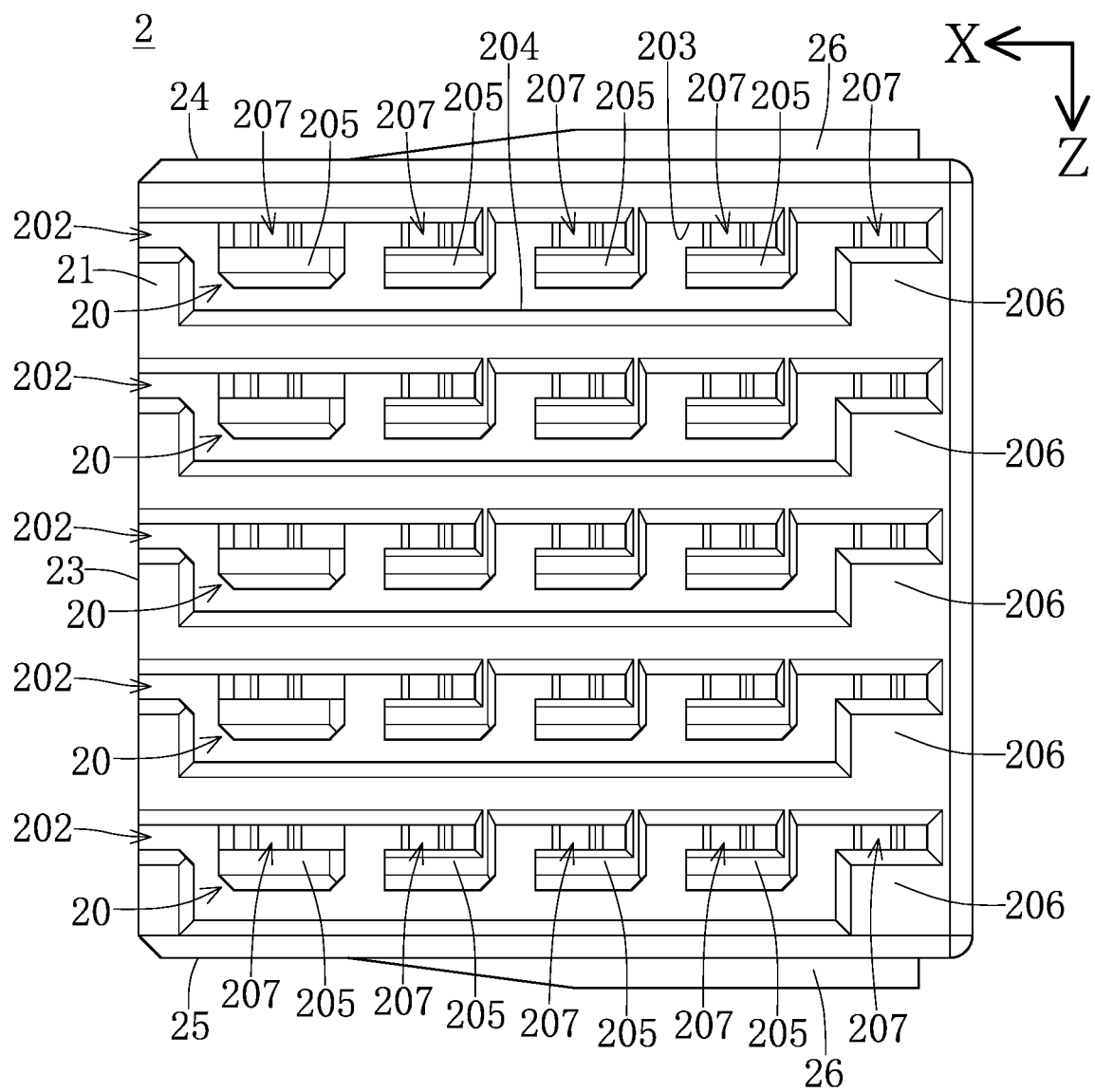
FIG. 4 is a schematic bottom view of the casing according to the first embodiment of the present disclosure.

Referring to FIG. 2 to FIG. 4, FIG. 3 is a schematic cross-sectional view of the casing according to the first embodiment of the present disclosure, and FIG. 4 is a schematic bottom view of the casing according to the first embodiment of the present disclosure. The casing 2 has a first surface 21, a third surface 22, a second surface 23, a fourth surface 24 and a fifth surface 25. The first surface 21 corresponds to the third surface 22, the fourth surface 24 corresponds to the fifth surface 25, the second surface 23 is connected between the first surface 21 and the third surface 22, and the second surface 23 is connected between the fourth surface 24 and the fifth surface 25. The interior of the casing 2 is divided into a plurality of accommodating grooves 20, each accommodating groove 20 defines an opening 201 on the first surface 21, each accommodating groove 20 defines a slot 202 (such as a slot opening) on the second surface 23, and the opening 201 and the slot 202 of each of the accommodating grooves 20 are communicated with each other. In this embodiment, the first surface 21 and the second surface 23 are two adjacent surfaces of the casing 2. In addition, the casing 2 also has two stopper portion 26 respectively disposed on the fourth surface 24 and the fifth surface 25 and extended along the X-axis direction, each stopper portion 26 has an inclined surface 261, and the height between the inclined surface 261 and one of the fifth surface 25 and the fourth surface 24 is gradually decreased toward the positive X-axis direction.

As mentioned above, each accommodating groove 20 has a first inner wall 203 and a second inner wall 204 (as shown in FIG. 4) disposed opposite to each other, and a plurality of cylinders 205 (such as four cylinders 205 in this embodiment) and a stepped portion 206 are disposed in each of the accommodating grooves 20. The cylinders 205 are located between the first inner wall 203 and the second inner wall 204, and connected to the first inner wall 203 (for example, the cross section of each cylinder 205 in the X-Z plane is L-shaped as shown in FIG. 4), and the stepped portion 206 is disposed on the second inner wall 204. In addition, as shown in FIG. 3 and FIG. 4, a plurality of mortise structures 207 (such as socket structures) are formed in each accommodating groove 20. More particularly, the mortise structures 207 are respectively formed between each cylinder 205 and the first inner wall 203, and between the stepped portion 206 and the first inner wall 203.

Figure 5:
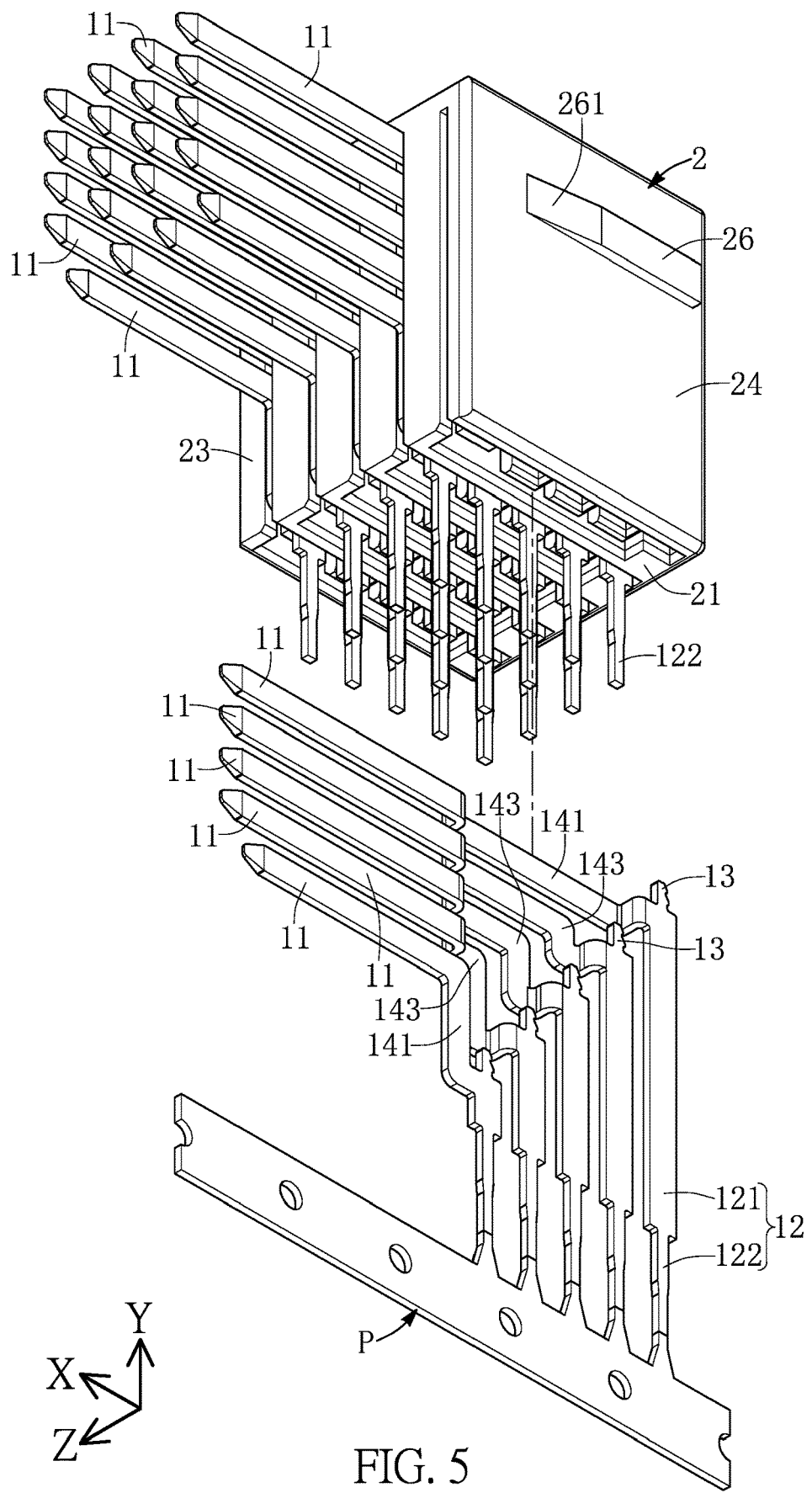
FIG. 5 is a schematic assembled view of the conductive terminal and the casing according to the first embodiment of the present disclosure.
Figure 6:
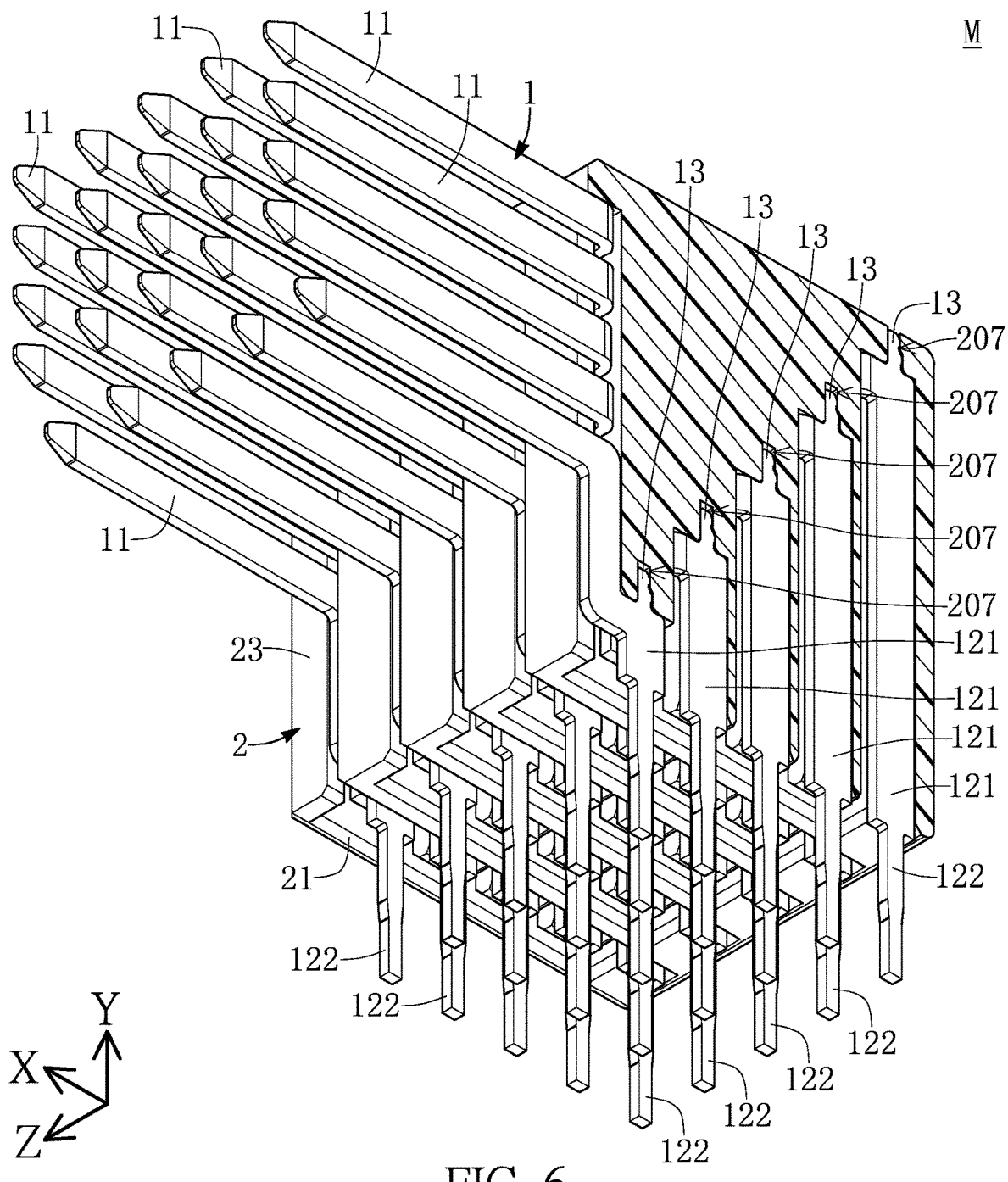
FIG. 6 is a schematic cross-sectional view of a conductive terminal assembly according to the first embodiment of the present disclosure.

Next, referring to FIG. 5 and FIG. 6, the soldering portions 122 of the contact pins 12 of each conductive terminal row are coplanar, and the contact arms 11 of each conductive terminal row are coplanar. The plane formed by the soldering portion 122 and the plane formed by the contact arms 11 are parallel to each other, and are preferably coplanar (i.e., the two planes are coincident). In addition, the front ends of the contact arms 11 of the conductive terminals 1 can form another plane parallel to the Y-Z plane. It is worth mentioning that the front ends of the contact arms 11 of the conductive terminals 1 can be on the same plane or be divided into two or more planes (see the frontmost part of the contact arms 11 of the conductive terminals 1 facing the positive X-axis direction in FIG. 1, FIG. 5 and FIG. 6).

Continuing to refer to FIG. 5 and FIG. 6, it is worth mentioning that the contact arms 11 of the conductive terminals 1 in the related art are zigzag rather than coplanar, which is different from the present disclosure. Therefore, each row of conductive terminals in the present disclosure can be entered through the opening 201 of the corresponding accommodating slot 20, and finally inserted along a positioning direction (i.e., a positive Y-axis direction) for positioning (i.e., the tenon structures 13 being respectively clamped into the mortise structures 207). The contact arms 11 in each row of conductive terminals can protrude from the slots 202 of the corresponding accommodating groove 20, the contact pins 12 in each row of conductive terminals can protrude from the openings 201 of the corresponding accommodating groove 20, and the extension parts 14 are respectively located in the corresponding accommodating groove 20. The tenon structure 13 is connected to one side of the conductive terminal 1 and extends along the positioning direction. When each row of conductive terminals is inserted into one of the accommodating grooves 20, the tenon structures 13 of each conductive terminal row (including the conductive terminals 1) are respectively clamped into the mortise structures 207 (such that the tenon structures 13 and the mortise structures 207 interfere with each other). Furthermore, the outline shape of each mortise structure 207 is generally designed to correspond to the corresponding tenon structure 13 and its hook portion 131, so that each tenon structure 13 can be clamped to and interfered with the corresponding mortise structure 207 so as to position each conductive terminal 1 inside the casing 2. It should be noted that after the rows of conductive terminals are inserted into the casing 2, the metal strip P of each row of conductive terminals can be removed.

Figure 8:
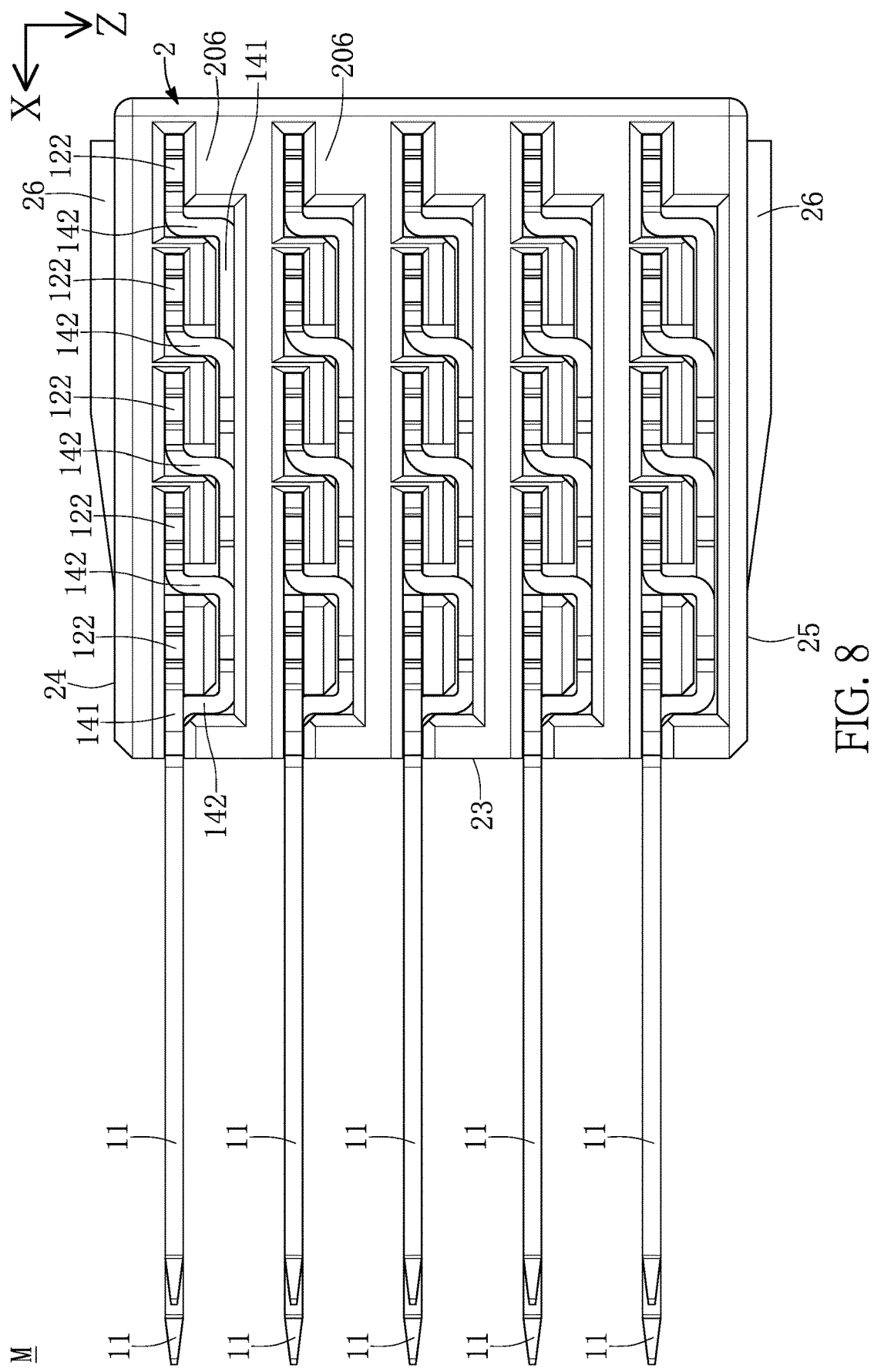
FIG. 8 is a schematic bottom view of the conductive terminal assembly according to the first embodiment of the present disclosure.

Referring to FIG. 7 and FIG. 8, FIG. 8 is a schematic bottom view of the conductive terminal assembly according to the first embodiment of the present disclosure. In the present disclosure, through the design of the accommodating grooves 20 inside the casing 2, each row of conductive terminals can be inserted into the corresponding accommodating groove 20, the contact arm 11 of each conductive terminal 1 can protrude from the slot 202 of the corresponding accommodating groove 20, the contact pin 12 can protrude from the opening 201 of the corresponding accommodating groove 20, and the extension part 14 can be located in the corresponding accommodating groove 20.

The tenon structure 13 of each conductive terminal 1 is clamped into the corresponding mortise structure 207, and the structure of the extension part 14 of each conductive terminal 1 can bypass the other cylinders 205 (as shown in FIG. 8). That is to say, the cylinders 205 can be configured as guide rails so that the extension parts 14 are smoothly reciprocated along the extending direction (i.e., the Y-axis direction) of the cylinders 205, the extending section 141 of the extension part 14 in a part of the conductive terminal 1 is close to the second inner wall 204, and is separated from the first inner wall 203 by at least one of the cylinders 205. Therefore, the present disclosure can respectively insert the conductive terminals 1 into one of the accommodating grooves 20 in a row form, so that the present disclosure can solve the question of the related art (which can only insert a single conductive terminal into the casing at one time during the assembly process) and improve the efficiency of the assembly process.

Figure 9:
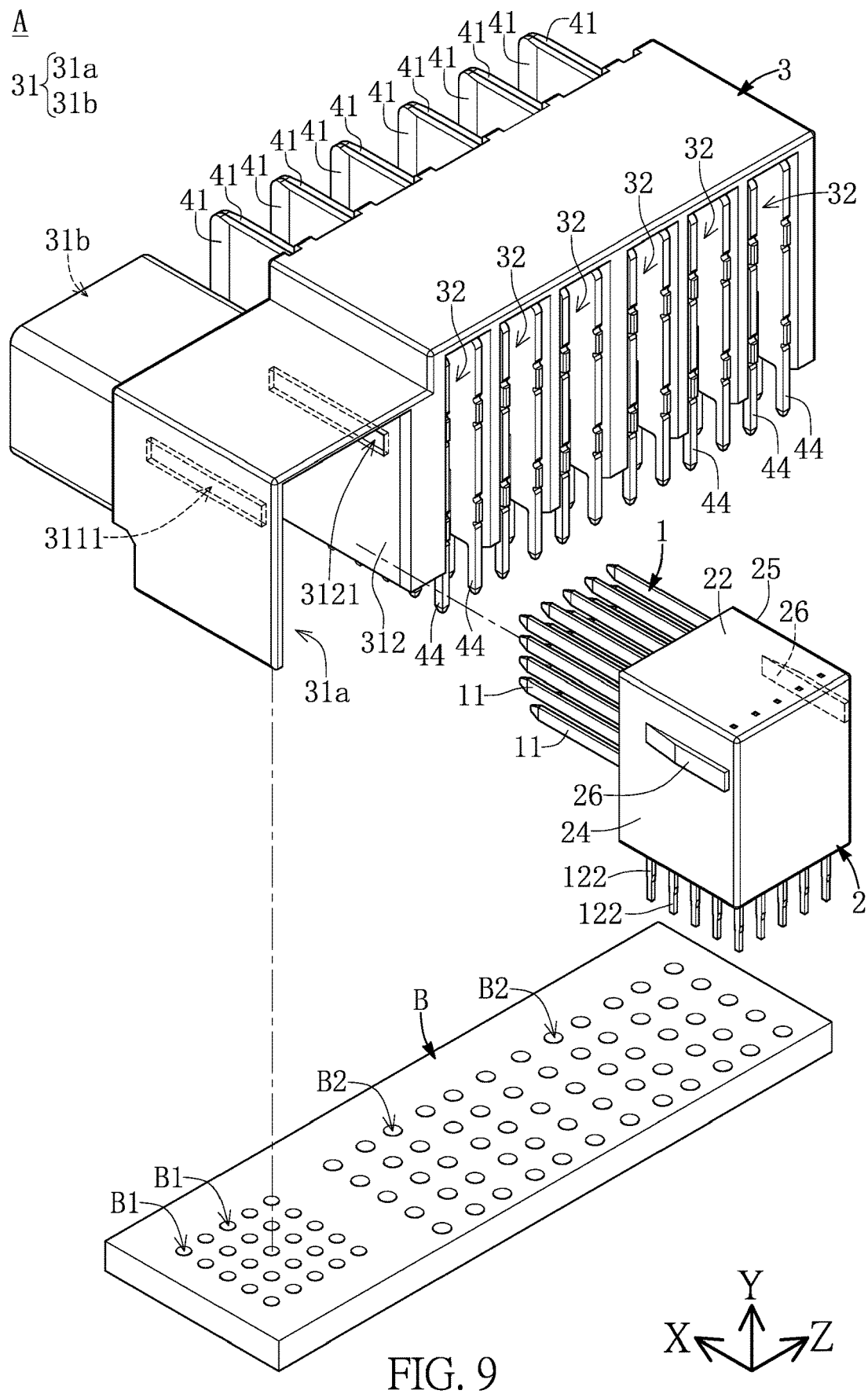
FIG. 9 is a partially schematic exploded view of a connector according to the first embodiment of the present disclosure.
Figure 10:
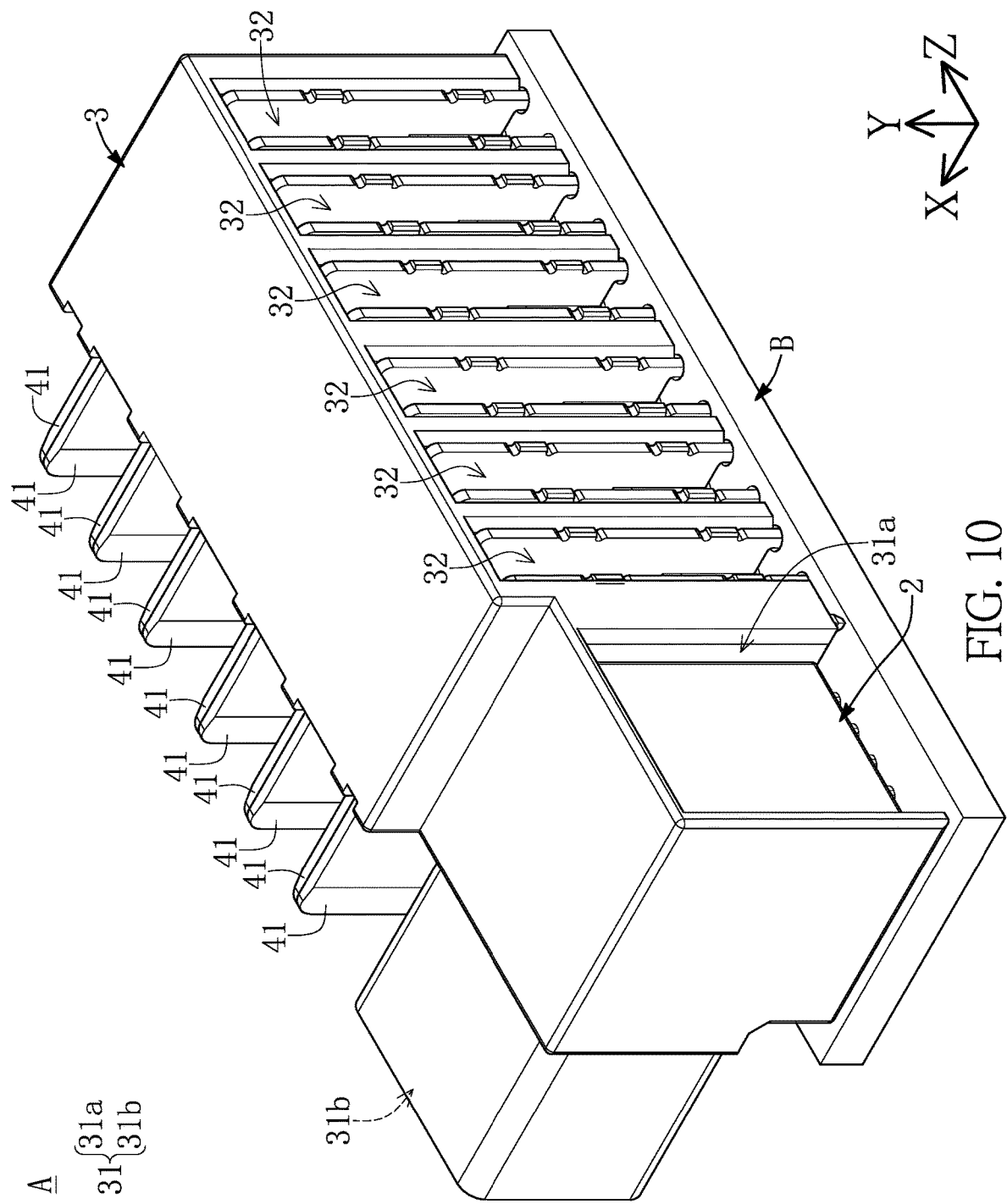
FIG. 10 is a schematic perspective view of the connector according to the first embodiment of the present disclosure.
Figure 14:
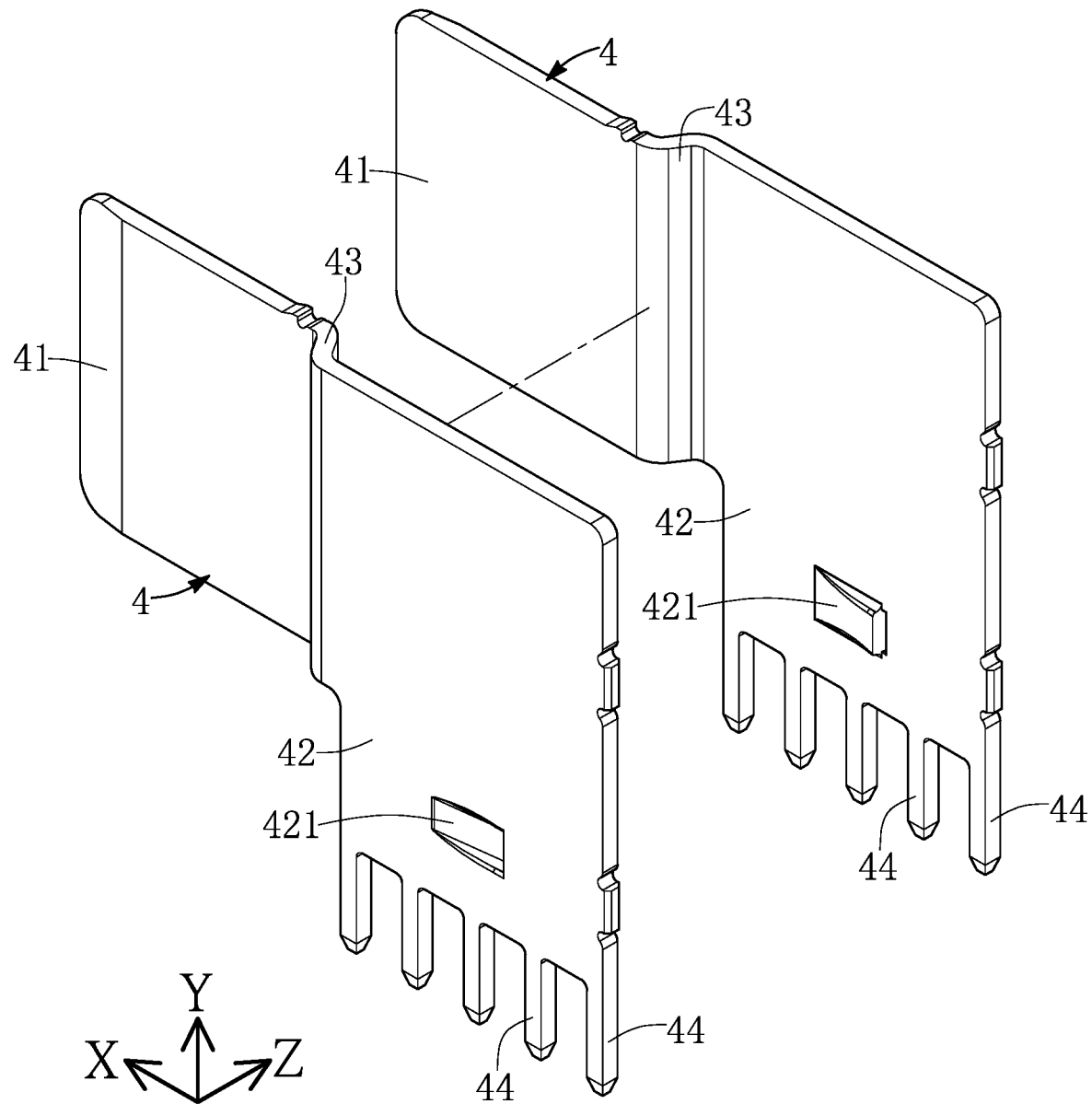
FIG. 14 is a schematic perspective view of a conductive element of the connector of the present disclosure.

Referring to FIG. 9 and FIG. 10, FIG. 9 is a partial schematic exploded view of the connector according to the first embodiment of the present disclosure. FIG. 10 is a schematic perspective view of the connector according to the first embodiment of the present disclosure. The present disclosure provides a connector A, which includes conductive terminal assemblies M (including a plurality of rows of conductive terminals and a casing 2), a cover 3 and a plurality of sets of conductive elements (such as a plurality of conductive assemblies). The cover body 3 has a first accommodating portion 31 and a plurality of second accommodating portions 32. The conductive terminal assembly M is disposed in the first accommodating portion 31. The conductive assemblies are respectively disposed in the second accommodating portions 32, and each of the conductive assemblies has two conductive elements 4 (as shown in FIG. 14) arranged in mirror symmetry. The connector A can be plugged into a circuit board B, the contact pins 12 of the rows of conductive terminals are respectively inserted into first insertion holes B1, and the foot posts 44 of the sets of conductive elements are respectively inserted into second insertion holes B2.

Figure 13:
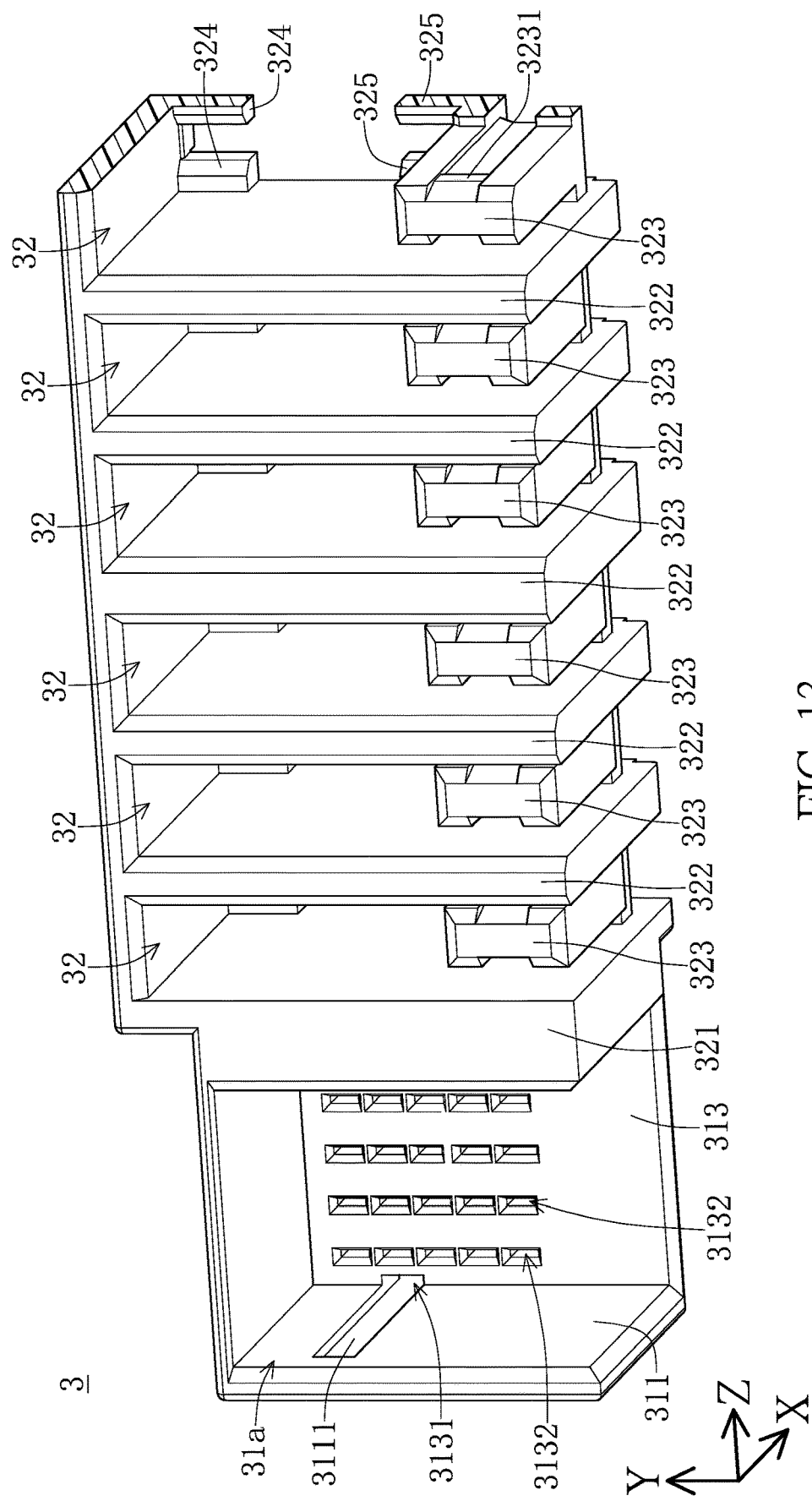
FIG. 13 is a schematic cross-sectional view of a cover of the connector of the present disclosure.

Continue to refer to FIG. 9 and FIG. 10, and also refer to FIG. 13, FIG. 13 is a schematic cross-sectional view of the cover of the connector of the present disclosure. The cover body 3 has a first wall body 321 and a plurality of second wall bodies 322. The first wall body 321 is used to separate the interior of the cover body 3 into the first accommodating portion 31, and the second wall bodies 322 are used to divide the space other than the first accommodating portion 31 inside the cover body 3 into the second accommodating portions 32. That is to say, the first wall body 321 is disposed between the first accommodating portion 13 and the adjacent second accommodating portion 32, and each second wall body 322 is configured to be disposed between two adjacent second accommodating portions 32. Furthermore, the first accommodating portion 31 has a partition wall 313 formed therein, and the partition wall 313 is used to separate the first accommodating portion 31 into a first accommodating space 31a and a second accommodating space 31b. Two trenches (3111, 3121) are respectively provided on the two opposite surfaces (311, 312) of the first accommodating portion 31, the partition wall 313 defines two first through holes 3131 at the position corresponding to the two adjacent trenches (3111, 3121), and the two first through holes 3131 are respectively communicated with the corresponding trenches (3111, 3121). In addition, the partition wall 313 has a plurality of through holes 3132, and the through holes 3132 correspond to the contact arms 11, respectively.

Continue to refer to FIG. 9, FIG. 10 and FIG. 13, and also refer to FIG. 14, FIG. 14 is a schematic perspective view of the conductive element of the connector of the present disclosure. Each second accommodating portion 32 has a separation post 323, two first guiding posts 324 and two second guiding posts 325 disposed thereinside. The two second guiding posts 325 are disposed above the separation post 323, and the two first guiding posts 324 are respectively disposed above the two second guiding posts 325. Each conductive element 4 includes a first sheet portion 41, a second sheet portion 42, a turning portion 43 and a plurality of foot posts 44. The second sheet portion 42 is connected between the first sheet portion 41 and the foot posts 44, and the turning portion 43 is connected between the first sheet portion 41 and the second sheet portion 42. The first sheet portion 41 is parallel to the second sheet portion 42, but the first sheet portion 41 and the second sheet portion 42 are not coplanar due to the design of the turning portion 43. The foot posts 44 extend in the first direction (i.e., the negative Y-axis direction) relative to the second sheet portion 42, and the first sheet portion 41 extends in the second direction (i.e., the positive X-axis direction) relative to the second sheet portion 42, and the first direction is perpendicular to the second direction. The two second sheet portions 42 are provided with two locking portions 421, and two lateral surfaces of the partition post 323 are provided with two convex blocks 3231 respectively corresponding to the two locking portions 421, respectively.

Figure 11:
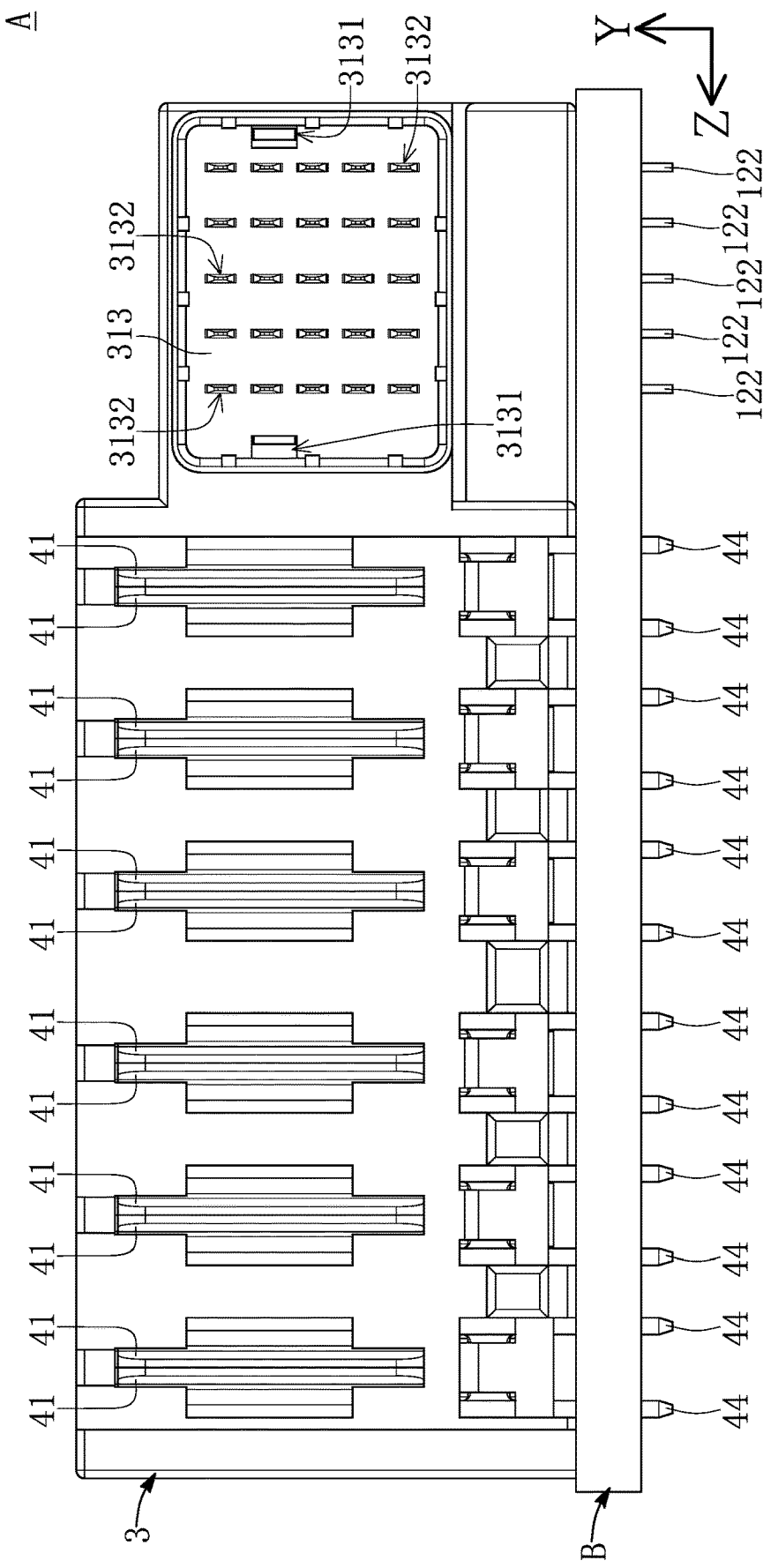
FIG. 11 is a schematic side view of the connector according to the first embodiment of the present disclosure.
Figure 12:
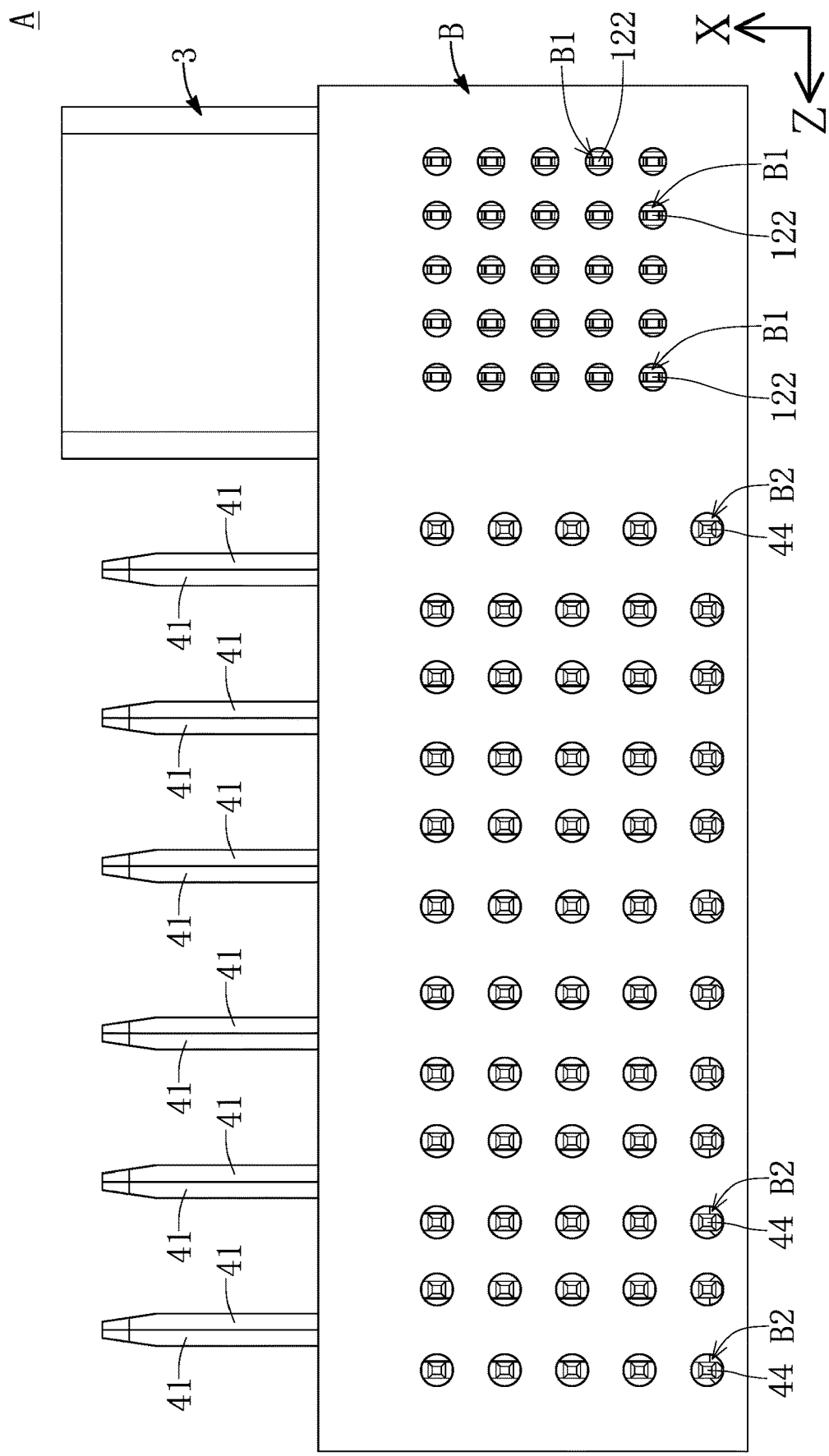
FIG. 12 is a schematic bottom view of the connector according to the first embodiment of the present disclosure.

Next, referring to FIG. 10 to FIG. 12, FIG. 11 is a schematic side view of the connector according to the first embodiment of the present disclosure, and FIG. 12 is a schematic bottom view of the connector according to the first embodiment of the present disclosure. When the conductive terminal assembly M is disposed in the first accommodating portion 31, the contact arms 11 of the conductive terminals 1 respectively pass through the through holes 3132, and the two stopper portions 26 are respectively clamped in the two trenches (3111, 3121) (that is to say, each stopper portion 26 can be easily clamped in the corresponding trench through the design of the inclined surface 261 of the stopper portion 26). In addition, when each conductive assembly (including two mirror-symmetrical conductive elements 4) is disposed in the corresponding second accommodating portion 32, the two first sheet portions 41 are sandwiched and contacted by the two first guiding posts 324 and the two second guiding posts 325, and the two second sheet portions 42 are separated by the separation post 323 and the two locking portions 421 respectively abut against the two convex blocks 3231. In addition, referring to both FIG. 6 and FIG. 12, it is worth mentioning that, in the conductive terminal rows of the conductive terminal assembly M in this embodiment, the soldering portions 122 of each conductive terminal row are coplanar (as shown in FIG. 6), or the ends of the soldering portions 122 of each conductive terminal row are collinear (as shown in FIG. 12).

Second Embodiment

Figure 15:
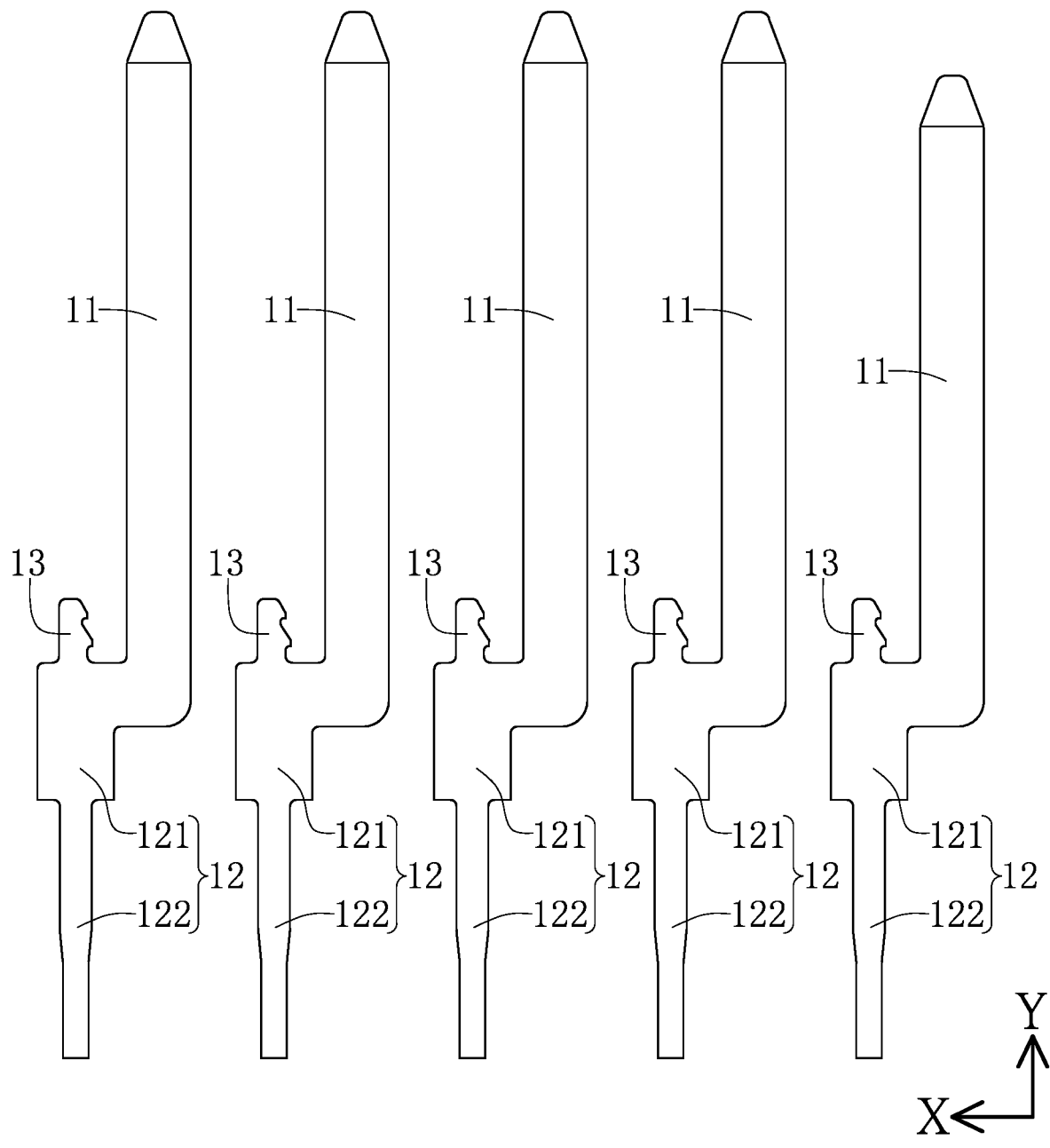
FIG. 15 is a schematic view of the conductive terminal according to a second embodiment of the present disclosure.

Referring to FIG. 15, FIG. 15 is a schematic view of a conductive terminal according to a second embodiment of the present disclosure. This embodiment mainly provides a conductive terminal 1 with a different structure. The difference between the second embodiment and the first embodiment is that the extension direction of the contact arm 11 of the conductive terminal 1 (see any one of the conductive terminals 1 arranged in a row form in FIG. 15) of the present embodiment relative to the body portion 121 is parallel to the extension direction of the tenon structure 13 relative to the body portion 121. In other words, the extension direction of the tenon structure 13 from one side of the conductive terminal 1 can be designed differently depending on practical requirements.

Third Embodiment

Figure 16:
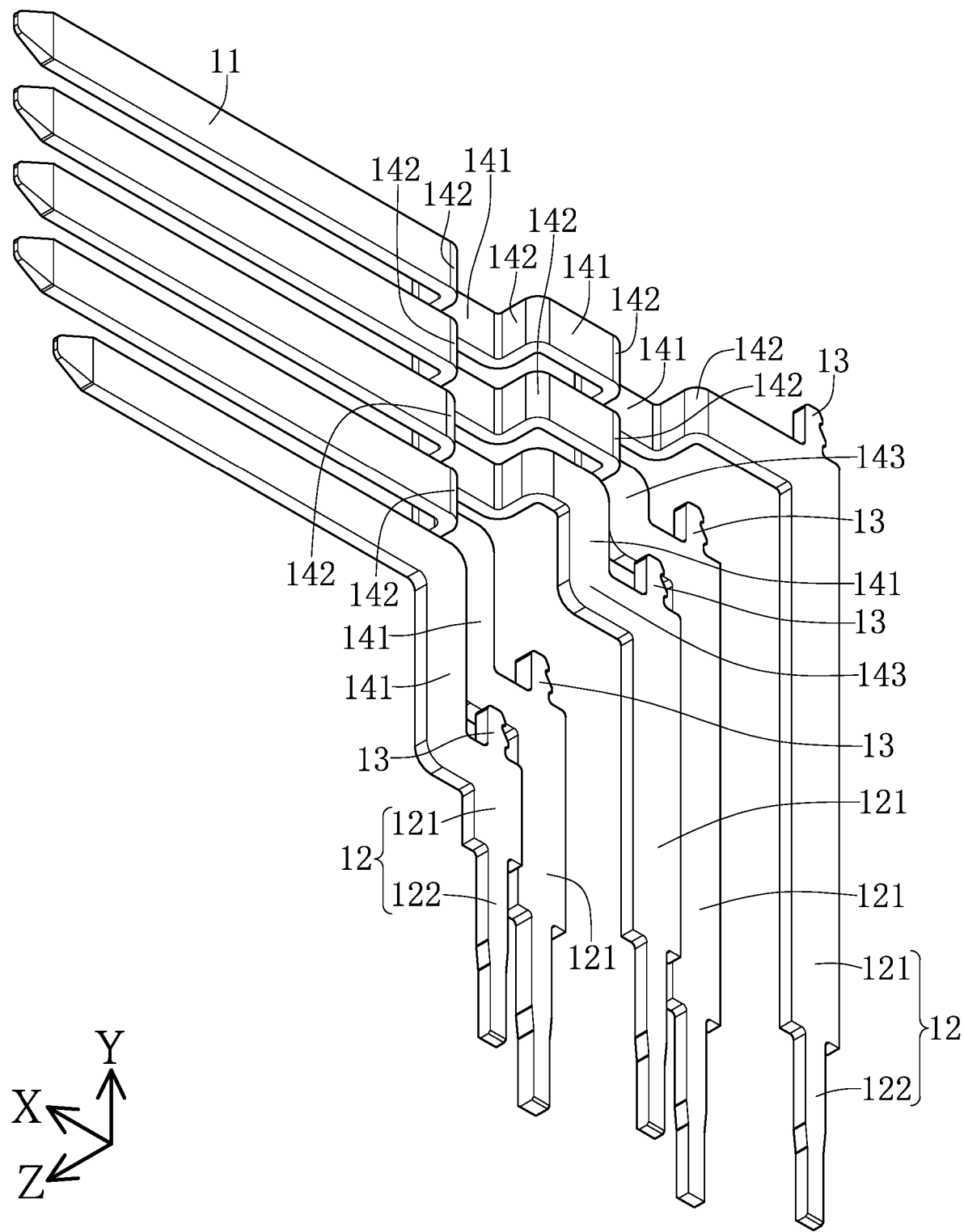
FIG. 16 is a schematic perspective view of the conductive terminal according to a third embodiment of the present disclosure.

Referring to FIG. 16, FIG. 16 is a schematic perspective view of a conductive terminal according to a third embodiment of the present disclosure. The conductive terminal 1 of this embodiment has a similar structure to the conductive terminal 1 of the first embodiment, and the similar content will not be repeated. The difference between the conductive terminal 1 of the present embodiment and the conductive terminal 1 of the first embodiment is that the extension part 14 of each conductive terminal 1 of the present embodiment includes at least one extending section 141, the extension part 14 of a part of the conductive terminal 1 further includes at least one bending section 142, one end of the bending section 142 is connected to the extending section 141, and the other end of the bending section 142 is connected to another extending section 141 or the contact arm 11, so that each extending section 141 and two bending sections 142 that are respectively connected to two ends of the extending section 141 form a U-shaped structure.

For example, as shown in FIG. 16, the extension part 14 of the rightmost conductive terminal 1 along the X-axis direction includes three extending sections 141 and four bending sections 142, and the four bending sections 142 are configured to be arranged in the three extending sections 141 to form three U-shaped structures. In addition, the second conductive terminal 1 counted from the far right along the X-axis direction in FIG. 16 includes three extending sections 141 and three bending sections 142, one of the extending sections 141 further includes a curved portion 143 having an L-shaped shape, one of the bending sections 142 is connected between the extending section 141 and the contact arm 11, and the other two bending sections 142 are respectively disposed between the two extending sections 141 to form two U-shaped structures. In addition, as shown in FIG. 16, the middle conductive terminal 1 (i.e., the third conductive terminal 1 is counted from the far right in the X-axis direction) includes two extending sections 141 and two bending sections 142, one of the bending sections 142 is connected between the extending section 141 and the contact arm 11, and the other bending section 142 is arranged between the two extending sections 141 (one of the extending sections 141 has a bent portion 143 and is in an L-shaped shape) so as to form a U-shaped structure. In addition, the fourth conductive terminal 1 counted from the far right along the X-axis direction in FIG. 16 includes an extending section 141 and a bending section 142. The extending section 141 has a curved portion 143 and is in an L-shaped shape. The bending section 142 is connected between the extending section 141 and the contact arm 11 to form a U-shaped structure. In other words, except for the leftmost conductive terminal 1, the contact arms 11 of the other conductive terminals 1 are located on the first plane, and at least one extending section 141 of the extension part 14 is located on the second plane, and the first plane and the second plane are different planes.

As mentioned in the previous paragraph, in other embodiments, the extension part 14 can serve as a contact arm, and the contact arm 11 can serve as a contact pin. Therefore, the conductive terminals 1 of the conductive terminal row belonging to the same metal strip P can define a first plane and a second plane parallel to the X-Y plane. The extending section 141 of at least one of the conductive terminals 1 is connected between the contact arm 11 and the contact pin 12, and the extending section 141 has at least one bending section 142, so that one part of the extending section 141 is located on the first plane, another part of the extending section 141 is located on the second plane. The contact arms 11 and the contact pins 12 of the conductive terminals 1 are located on at least one of the first plane and the second plane, preferably the contact arms 11 and the contact pins 12 of the conductive terminals 1 are located on the first plane.

Figure 17:
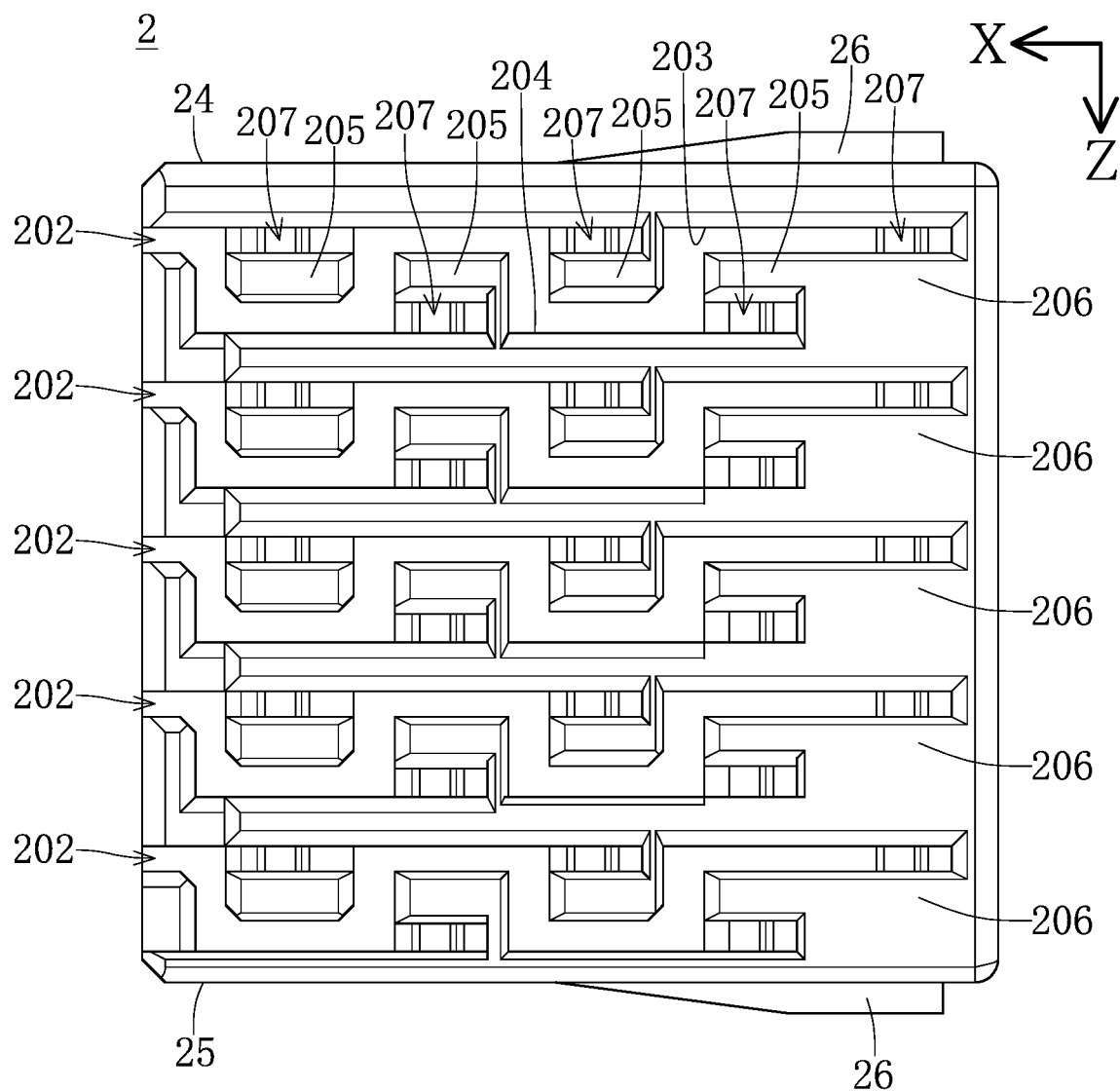
FIG. 17 is a schematic bottom view of the casing according to the third embodiment of the present disclosure.

Referring to FIG. 17, FIG. 17 is a schematic bottom view of the casing according to the third embodiment of the present disclosure. The casing 2 of this embodiment has a structure similar to that of the casing 2 of the first embodiment, and the similar content will not be repeated. The difference between the casing 2 of the present embodiment and the casing 2 of the first embodiment is that one of the cylinders 205 in the casing 2 of the present embodiment is connected to the stepped portion 206, and a part of the cylinders 205 is connected to the first inner wall 203, and the other part of the cylinders 205 is connected to the second inner wall 204 (that is to say, all the cylinders 205 in the first embodiment are connected to the first inner wall 203.

Figure 18:
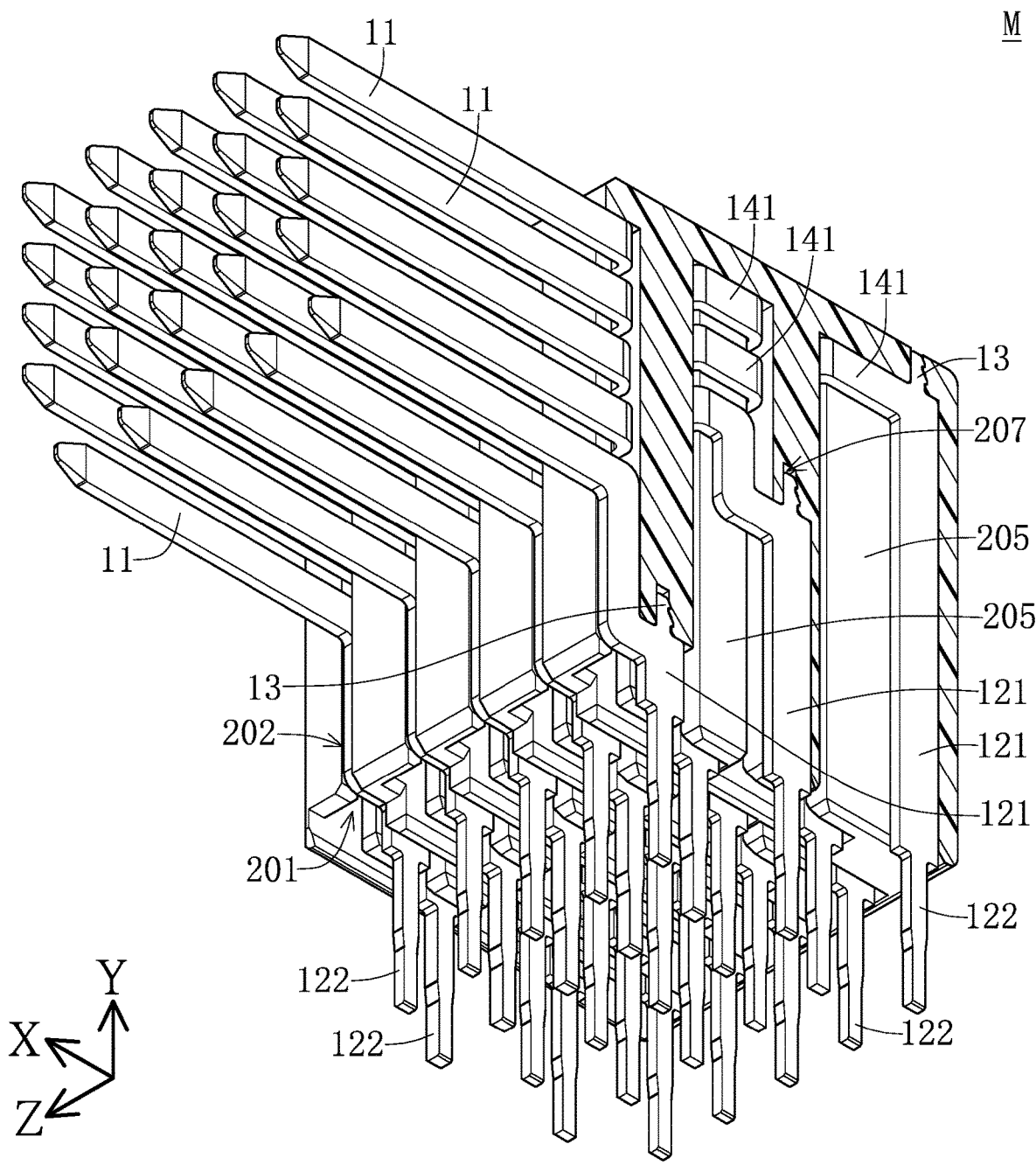
FIG. 18 is a schematic cross-sectional view of the conductive terminal assembly according to the third embodiment of the present disclosure.
Figure 19:
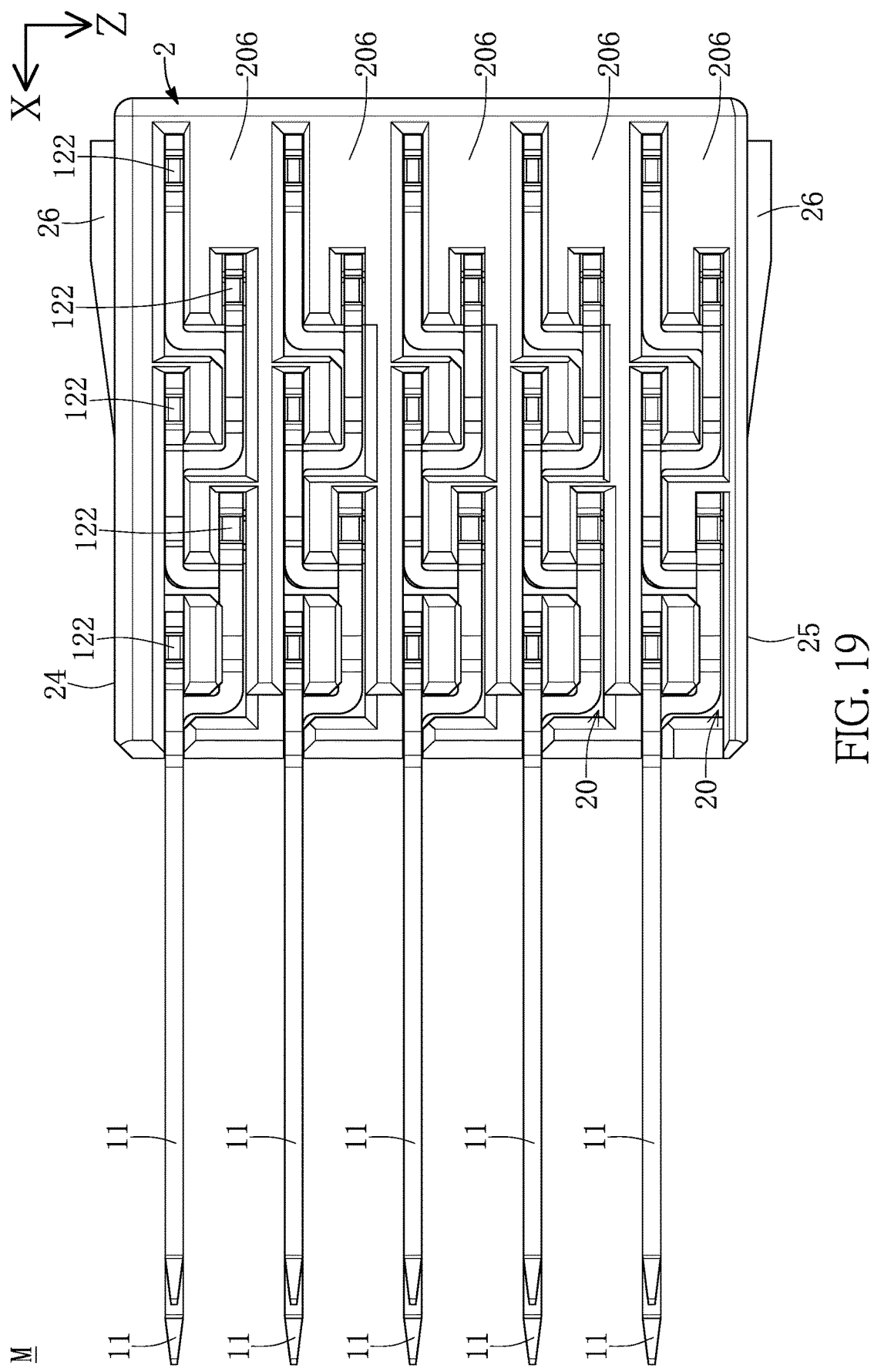
FIG. 19 is a schematic bottom view of the conductive terminal assembly according to the third embodiment of the present disclosure.

Referring to FIG. 16, FIG. 18 and FIG. 19, FIG. 18 is a schematic cross-sectional view of the conductive terminal assembly according to the third embodiment of the present disclosure, and FIG. 19 is a schematic bottom view of the conductive terminal assembly according to the third embodiment of the present disclosure. Each conductive terminal row can be inserted through the opening 201 of the corresponding accommodating groove 20, and the contact arms 11 in each conductive terminal row can be protruded from the slots 202 of the corresponding accommodating groove 20. When each row of conductive terminals is inserted into one of the accommodating grooves 20, the tenon structures 13 of each row of conductive terminals (including the plurality of conductive terminals 1) are respectively clamped to and interfered with the mortise structures 207, and the structural design of the extension part 14 of each conductive terminal 1 can bypass the other cylinders 205. Furthermore, the outline shape of each mortise structure 207 is generally designed to correspond to the corresponding tenon structure 13, so that each tenon structure 13 can be clamped into the corresponding mortise structure 207 so as to position each conductive terminal 1 in the casing 2.

Figure 20:
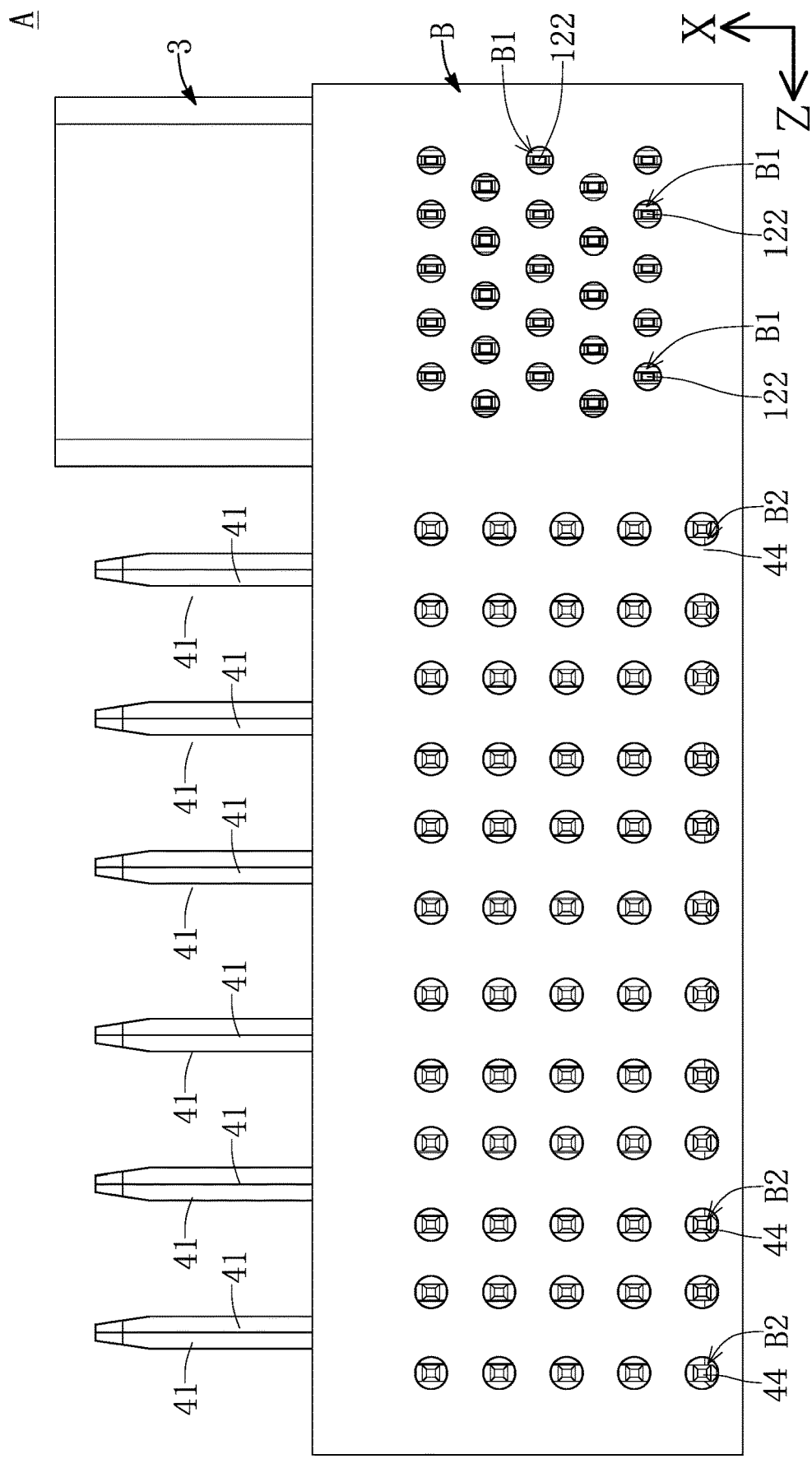
FIG. 20 is a schematic bottom view of the connector according to the third embodiment of the present disclosure.

In addition, referring to FIG. 16 and FIG. 20, FIG. 20 is a schematic bottom view of the connector according to the third embodiment of the present disclosure. It should be noted that, in the conductive terminals 1 arranged side by side in this embodiment as shown in FIG. 16, the contact arms 11 of the conductive terminals 1 are coplanar, but the contact pins 12 of the conductive terminals 1 are not coplanar. Specifically, as shown in FIG. 16, the soldering portions 122 of the contact pins 12 of the first, third, and fifth conductive terminals 1 counted from the far right in the X-axis direction are located on the same plane, but the soldering portions 122 of the contact pins 12 of the second and fourth conductive terminals 1 are located on another plane (that is to say, the soldering portion 122 of the contact pin 12 of the first, third, and fifth conductive terminals 1 and the soldering portion 122 of the contact pin 12 of the second and fourth conductive terminals 1 122 are not on the same line). Therefore, as further shown in FIG. 2, when the rows of conductive terminals of the conductive terminal assembly M of the connector A of the present embodiment are inserted into the circuit board B, the arrangement of the soldering portions 122 of the contact pins 12 of the rows of conductive terminals is different from the first embodiment (comparing FIG. 12 and FIG. 20). The soldering portions 122 of two adjacent rows of conductive terminals of this embodiment are staggered, but the soldering portions 122 of two adjacent rows of conductive terminals of the first embodiment are aligned.

Beneficial Effects of the Embodiments

In conclusion, one of the beneficial effects of the present disclosure is that the conductive terminal 1, the conductive terminal assembly M and the connector A provided by the present disclosure can position the conductive terminals 1 on the casing 2 through the tenon structure 13 of the conductive terminal 1 so as to strengthen the structural strength of positioning the conductive terminal 1 on the casing 2. In addition, the present disclosure can also divide the interior of the casing 2 into a plurality of accommodating grooves 20, so that the plurality of conductive terminals 1 can be inserted into one of the accommodating grooves 20 in a row form, so that the present disclosure can solve the question of the related art (which can only insert a single conductive terminal into the casing at one time during the assembly process) and improve the efficiency of the assembly process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A conductive terminal, comprising:
   a contact arm extending along a first direction;
   a contact pin extending along a second direction, wherein the first direction is perpendicular to the second direction;
   an extension part connected between the contact arm and the contact pin, wherein the extension part is bent and extended relative to the contact pin; and
   a tenon structure connected between one of the contact pin or the contact arm and the extension part, wherein the tenon structure parallelly extends along the first direction or the second direction.

2. The conductive terminal according to claim 1, wherein the extension part includes at least one extending section and a plurality of bending sections, and two ends of the at least one extending section are respectively connected to two of the bending sections to form at least one U-shaped structure.

3. The conductive terminal according to claim 2, wherein the contact arm is located on a first plane, the extending section is located on a second plane, and the first plane and the second plane are not coplanar.

4. The conductive terminal according to claim 1, wherein the extension part includes an extending section and a bending section, and the bending section is connected between the extending section and the contact arm.

5. The conductive terminal according to claim 1, wherein the tenon structure has at least one hook portion formed on at least one side thereof.

6. A conductive terminal assembly, comprising:
   a casing having a plurality of accommodating grooves formed thereinside, wherein each of the accommodating grooves has an opening formed on a first surface thereof, and a slot formed on a second surface thereof, and the opening and the slot of each of the accommodating grooves are communicated with each other; and
   at least one conductive terminal row including a plurality of conductive terminals arranged side by side, wherein the conductive terminals are inserted into one of the accommodating grooves and positioned along a positioning direction, and each of the conductive terminals includes a tenon structure connected to one side of the conductive terminal and extended along the positioning direction;
   wherein each of the conductive terminals includes a contact arm, a contact pin and an extension part, the extension part is connected between the contact arm and the contact pins, the contact arm protrudes from the slot of a corresponding one of the accommodating grooves, the contact pin protrudes from the opening of the corresponding accommodating groove, and the extension part is located in the corresponding accommodating groove.

7. The conductive terminal assembly according to claim 6, wherein the tenon structure of each of the conductive terminals is parallel to the contact arm or the contact pin.

8. The conductive terminal assembly according to claim 6, wherein each of the conductive terminals includes a contact arm, a contact pin and an extension part, the extension part is connected between the contact arm and the contact pins, the extension part of at least one of the conductive terminals includes at least one extending section and a plurality of bending sections, and two ends of the at least one extending section are respectively connected to two of the bending sections to form at least one U-shaped structure.

9. The conductive terminal assembly according to claim 8, wherein the contact arm is located on a first plane, the at least one extending section is located on a second plane, the first plane and the second plane are not coplanar.

10. The conductive terminal assembly according to claim 6, wherein a plurality of mortise structures are disposed inside each of the accommodating grooves, and when the conductive terminals are inserted into one of the accommodating grooves and positioned, the tenon structures are respectively clamped into the mortise structures.

11. The conductive terminal assembly according to claim 6, wherein each of the accommodating grooves has a first inner wall and a second inner wall opposite to each other, and a plurality of cylinders are located between the first inner wall and the second inner wall of each of the accommodating grooves.

12. The conductive terminal assembly according to claim 11, wherein each of the accommodating grooves has a stepped portion disposed on the second inner wall thereof, and one of the cylinders is connected to the stepped portion.

13. The conductive terminal assembly according to claim 12, wherein a part of the cylinders is disposed on the first inner wall, another part of the cylinders is disposed on the second inner wall, two mortise structures are respectively formed between each of the cylinders and one of the first inner wall and the second inner wall, and between the stepped portion and the first inner wall, and when the conductive terminals are inserted into one of the accommodating grooves, the tenon structures are respectively clamped into the mortise structures.

14. A connector, comprising:
a cover having a first accommodating portion and a plurality of second accommodating portions;
the conductive terminal assembly as claimed in claim 6 disposed in the first accommodating portion; and
a plurality of conductive assemblies respectively disposed in the second accommodating portions, wherein each of the conductive assemblies includes two conductive elements arranged in mirror symmetry, each of the conductive elements includes a first sheet portion, a second sheet portion, a turning portion and a plurality of foot posts, the second sheet portion is connected between the first sheet portion and the foot posts, the turning portion is connected between the first sheet portion and the second sheet portion, the foot posts extend along a first direction, the first sheet portion extends along a second direction, and the first direction is perpendicular to the second direction.

15. The connector according to claim 14, wherein the first accommodating portion has a partition wall formed therein, the partition wall is configured to partition the first accommodating portion into a first accommodating space and a second accommodating space, and the partition wall has a plurality of through holes respectively corresponding to the contact arms.

16. The connector according to claim 15, wherein the first accommodating portion has two trenches respectively formed on two opposite surfaces thereof, the partition wall has two first through holes respectively formed on the two adjacent trenches, and each of the first through holes is communicated with a corresponding one of the trenches.

17. The connector according to claim 14, wherein the cover includes a first wall body and a plurality of second wall bodies, the first wall body is disposed in the first accommodating portion and the second accommodating portion that are adjacent to each other, and each of the second wall bodies is disposed between two adjacent ones of the second accommodating portions.

18. The connector according to claim 14, wherein each of the second accommodating portions has a separation post, two first guiding posts and two second guiding posts disposed thereinside, the two second guiding posts are disposed above the separation post, and the two first guiding posts are respectively disposed above the two second guiding posts.

19. The connector according to claim 18, wherein each of the two second sheet portions has a locking portion, and the separation post has two convex blocks respectively disposed on two lateral surfaces thereof to respectively correspond to the two locking portions of the two second sheet portions.

* * * * *